United States Patent
Itoh et al.

(10) Patent No.: US 8,325,553 B2
(45) Date of Patent: *Dec. 4, 2012

(54) STATIC MEMORY CELL HAVING INDEPENDENT DATA HOLDING VOLTAGE

(75) Inventors: Kiyoo Itoh, Tokyo (JP); Koichiro Ishibashi, Saitama (JP)

(73) Assignee: Renesas Electronics Corporation, Kanagawa (JP)

(*) Notice: Subject to any disclaimer, the term of this patent is extended or adjusted under 35 U.S.C. 154(b) by 0 days.

This patent is subject to a terminal disclaimer.

(21) Appl. No.: 13/154,919

(22) Filed: Jun. 7, 2011

(65) Prior Publication Data

US 2011/0235439 A1    Sep. 29, 2011

Related U.S. Application Data

(63) Continuation of application No. 12/722,222, filed on Mar. 11, 2010, now Pat. No. 7,978,560, which is a continuation of application No. 11/724,158, filed on Mar. 15, 2007, now Pat. No. 7,706,205, which is a continuation of application No. 11/148,354, filed on Jun. 9, 2005, now Pat. No. 7,251,183, which is a continuation of application No. 10/637,693, filed on Aug. 11, 2003, now Pat. No. 6,917,556, which is a continuation of application No. 10/243,870, filed on Sep. 16, 2002, now Pat. No. 6,639,828, which is a continuation of application No. 10/122,328, filed on Apr. 16, 2002, now Pat. No. 6,469,950, which is a continuation of application No. 09/790,878, filed on Feb. 23, 2001, now Pat. No. 6,388,936, which is a continuation of application No. 09/472,147, filed on Dec. 27, 1999, now Pat. No. 6,215,716, which is a continuation of application No. 09/232,851, filed on Jan. 19, 1999, now Pat. No. 6,108,262, which is a continuation of application No. 08/929,890, filed on Sep. 15, 1997, now Pat. No. 5,894,433, which is a continuation of application No. 08/655,823, filed on May 31, 1996, now Pat. No. 5,668,770.

(30) Foreign Application Priority Data

Jun. 2, 1995    (JP) .................................. 1995-136349
Feb. 15, 1996   (JP) .................................. 1996-027574

(51) Int. Cl.
   *G11C 11/419* (2006.01)
(52) U.S. Cl. ........ 365/227; 365/229; 365/228; 365/226; 365/156; 365/154
(58) Field of Classification Search .................. 365/229, 365/228, 227, 226, 156, 154
   See application file for complete search history.

(56) References Cited

U.S. PATENT DOCUMENTS 4,310,900 A    1/1982    Tsujide
(Continued)

FOREIGN PATENT DOCUMENTS

JP    55-64686 w/abs A    5/1980
(Continued)

OTHER PUBLICATIONS

K. Itoh, "VLSI Memory" (issued by Baifukan), Nov. 1994, pp. 310-328, and pp. 351-371.
(Continued)

*Primary Examiner* — Andrew Q Tran
(74) *Attorney, Agent, or Firm* — Mattingly & Malur, PC

(57) ABSTRACT

A static memory cell, composed of cross-coupled MOS transistors having a relatively high threshold voltage, is equipped with MOS transistors for controlling the power supply line voltage of the memory cell. To permit the voltage difference between two data storage nodes in the inactivated memory cell to exceed the voltage difference between the two nodes when write data is applied from a data line pair DL and /DL to the two nodes in the activated memory cell, the power supply line voltage control transistors are turned on to apply a high voltage VCH to the power supply lines after the word line voltage is turned off. The data holding voltage in the memory cell can be activated to a high voltage independent of the data line voltage, and the data holding voltage can be dynamically set so that read and write operations can be performed at high speed with low power consumption.

4 Claims, 17 Drawing Sheets

U.S. PATENT DOCUMENTS

| | | | |
|---|---|---|---|
| 4,455,627 A | | 6/1984 | Oritani |
| 4,525,811 A | | 6/1985 | Masuoka |
| 4,785,342 A | | 11/1988 | Yamanaka et al. |
| 4,872,141 A | * | 10/1989 | Plus et al. .................. 365/154 |
| 4,896,299 A | | 1/1990 | Wada et al. |
| 4,901,284 A | | 2/1990 | Ochii et al. |
| 5,010,521 A | | 4/1991 | Matsui |
| 5,046,052 A | | 9/1991 | Miyaji et al. |
| 5,140,557 A | | 8/1992 | Yoshida |
| 5,159,215 A | | 10/1992 | Murotani |
| 5,226,014 A | | 7/1993 | McManus |
| 5,301,147 A | | 4/1994 | Guo et al. |
| 5,303,190 A | | 4/1994 | Pelley, III |
| 5,309,401 A | | 5/1994 | Suzuki et al. |
| 5,646,902 A | | 7/1997 | Park |
| 5,668,770 A | | 9/1997 | Itoh et al. |
| 5,757,702 A | | 5/1998 | Iwata et al. |
| 5,805,496 A | * | 9/1998 | Batson et al. .............. 365/154 |
| 5,894,433 A | | 4/1999 | Itoh et al. |
| 6,002,635 A | | 12/1999 | Matano |
| 6,088,286 A | | 7/2000 | Yamauchi et al. |
| 6,108,262 A | | 8/2000 | Itoh et al. |
| 6,141,240 A | | 10/2000 | Madan |
| 6,215,716 B1 | | 4/2001 | Itoh et al. |
| 6,285,593 B1 | | 9/2001 | Wong |
| 6,388,936 B2 | | 5/2002 | Itoh et al. |
| 6,469,950 B2 | | 10/2002 | Itoh et al. |
| 6,639,828 B2 | | 10/2003 | Itoh et al. |
| 6,795,332 B2 | | 9/2004 | Yamaoka |
| 6,917,556 B2 | | 7/2005 | Itoh et al. |
| 7,251,183 B2 | | 7/2007 | Itoh et al. |
| 7,706,205 B2 | * | 4/2010 | Itoh et al. .................. 365/227 |
| 7,978,560 B2 | * | 7/2011 | Itoh et al. .................. 365/227 |

FOREIGN PATENT DOCUMENTS

| | | | |
|---|---|---|---|
| JP | 58-211391 w/abs A | | 12/1983 |
| JP | 60-38796 | | 2/1985 |
| JP | 2-108297 | | 4/1990 |
| JP | 02108297 A | * | 4/1990 |
| JP | 3-083289 | | 4/1991 |
| JP | 4-276386 | | 10/1992 |
| JP | 6-103783 w/abs A | | 4/1994 |

OTHER PUBLICATIONS

G. Kitsukawa et al., "A 1-Mbit BiCMOS DRAM Using Temperature-Compensation Circuit Techniques", IEEE Journal of Solid-State Circuits, vol. 24, No. 3, Jun. 1989, pp. 597-602.

Y. Nakagome et al., "An Experimental 1.5-V 65Mb DRAM", IEEE Journal of Solid-State Circuits, vol. 26, No. 4, Apr. 1991, pp. 465-471.

M. Horiguchi et al., "Switched-Source-impedance CMOS Circuit for Low Standby Subthreshold Current Giga-Scale LSI's", IEEE Journal of Solid-State Circuits, vol. 28, No. 11, Nov. 1993, pp. 1131-1135.

K. Sawada et al., "An On-Chip High-Voltage Generator Circuit for EEPROMs with a Power Supply voltage below 2V", 1995 Symposium on VLSI Circuits Digest of Technical Papers, pp. 75-76.

* cited by examiner

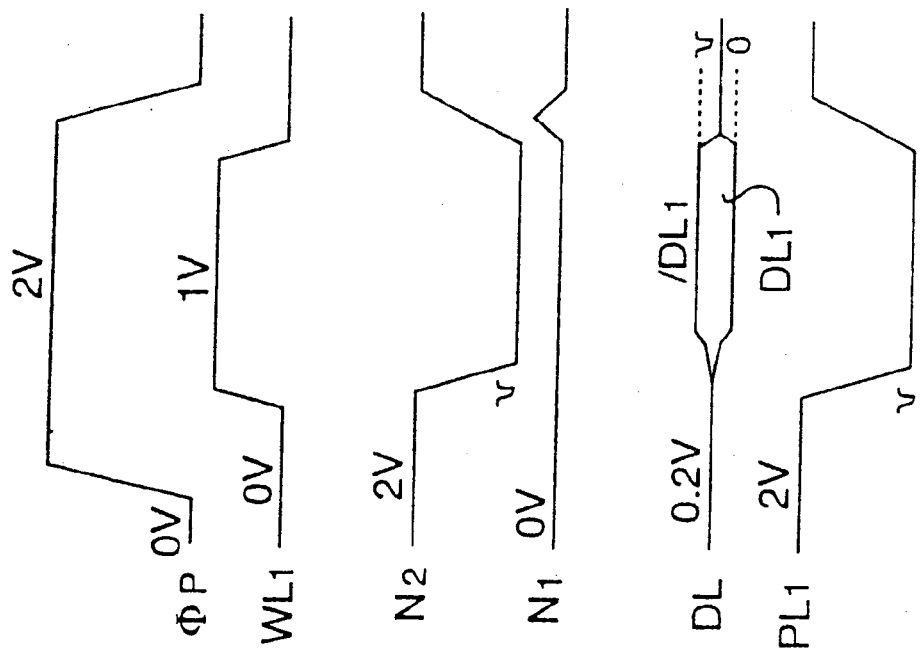
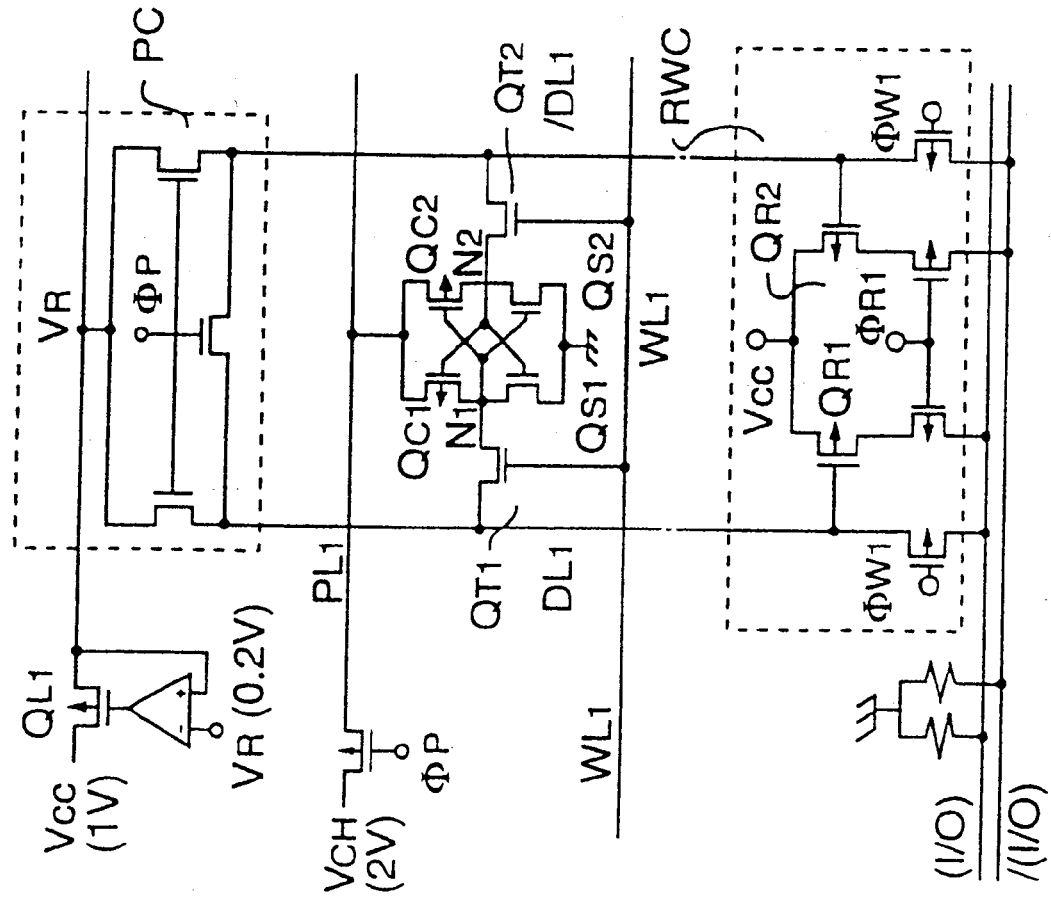
FIG. 6(a)
FIG. 6(b)

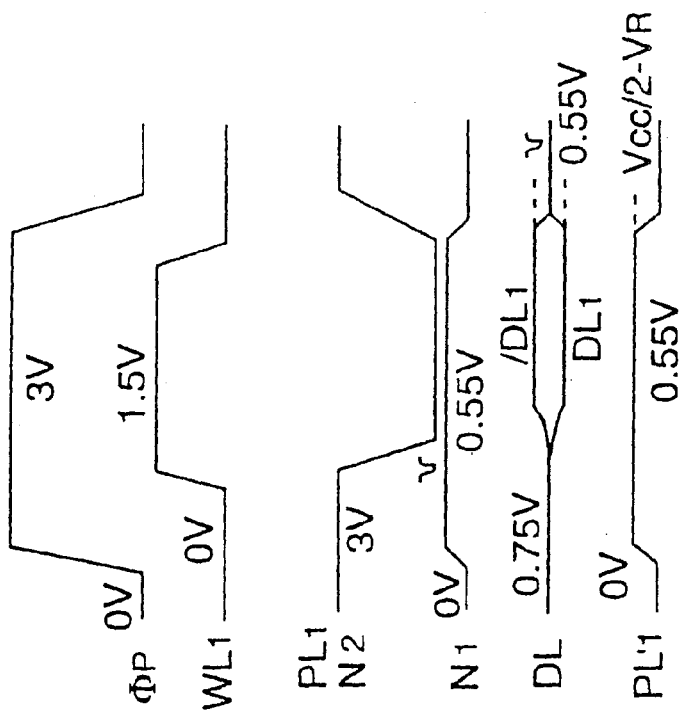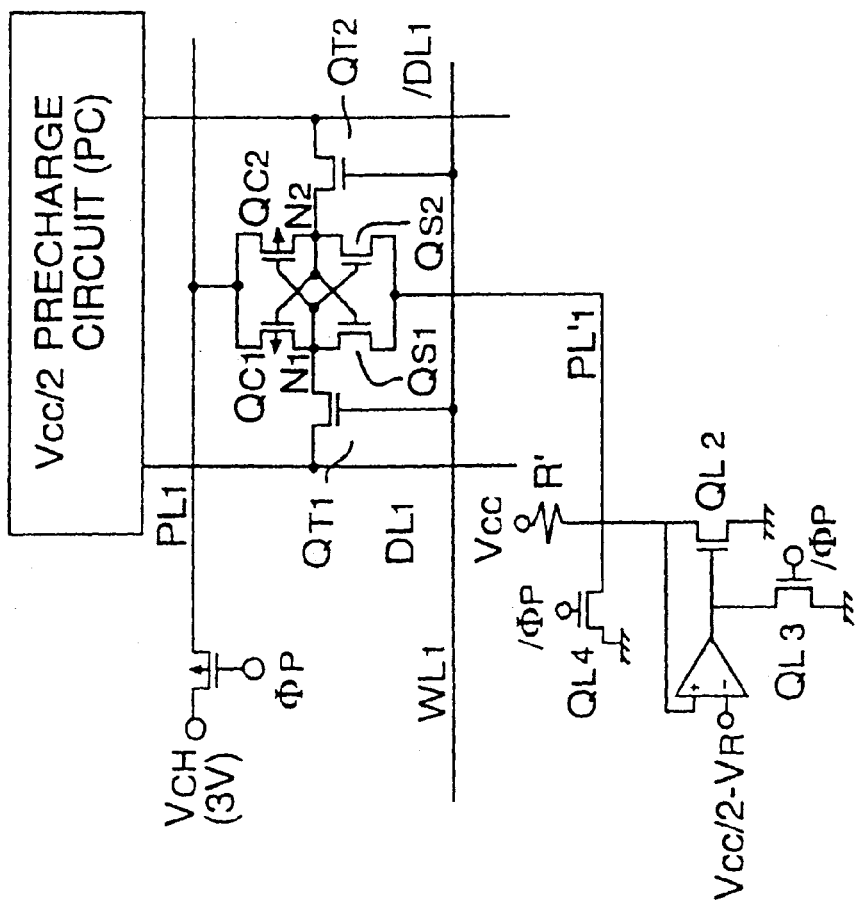
FIG. 7(a)
FIG. 7(b)

STATIC MEMORY CELL HAVING INDEPENDENT DATA HOLDING VOLTAGE

This application is a continuation application of U.S. application Ser. No. 12/722,222, filed Mar. 11, 2010, now U.S. Pat. No. 7,978,560, which is a continuation of U.S. application Ser. No. 11/724,158, filed Mar. 15, 2007 now U.S. Pat. No. 7,706,205, which is a continuation of U.S. application Ser. No. 11/148,354, filed Jun. 9, 2005 now U.S. Pat. No. 7,251,183, which is a continuation application of U.S. Ser. No. 10/637,693, filed Aug. 11, 2003, now U.S. Pat. No. 6,917,556, which is a continuation application of U.S. Ser. No. 10/243,870, filed Sep. 16, 2002, now U.S. Pat. No. 6,639,828, which is a continuation application of U.S. Ser. No. 10/122,328, filed Apr. 16, 2002, now U.S. Pat. No. 6,469,950, which is a continuation application of U.S. Ser. No. 09/790,878, filed Feb. 23, 2001, now U.S. Pat. No. 6,388,936, which is a continuation application of U.S. Ser. No. 09/472,147, filed Dec. 27, 1999, now U.S. Pat. No. 6,215,716, which is a continuation application of U.S. Ser. No. 09/232,851, filed Jan. 19, 1999, now U.S. Pat. No. 6,108,262, which is a continuation application of U.S. Ser. No. 08/929,890, filed Sep. 15, 1997, now U.S. Pat. No. 5,894,433, which is a continuation application of U.S. Ser. No. 08/655,823, filed May 31, 1996 now U.S. Pat. No. 5,668,770. The entire disclosures of all of the above-identified applications are hereby incorporated by reference. This application claims priority to JP 08-027574, filed Feb. 15, 1996 and JP 07-136349, filed Jun. 2, 1995.

BACKGROUND OF THE INVENTION

Field of the Invention

The present invention relates to a semiconductor integrated circuit that is operated at a low voltage and which employs a static memory cell composed of MIS (metal insulator semiconductor) or MOS (metal oxide semiconductor) transistors (hereafter, "MOS transistors"). More particularly, the present invention relates to a circuit suited for a high-speed/low-power static memory, such as SRAM (static random access memory).

A gate-insulated field-effect transistor, such as a MOS transistor, requires an operating voltage that decreases as the transistor size decreases, because the breakdown voltage of the transistor decreases with the smaller size. As well, the threshold voltage (VT) of the MOS transistor must be lowered in accordance with the drop of operating voltage so as to retain high-speed operation, because the operating speed is dominated by the effective gate voltage of the MOS transistor (i.e., the operating voltage minus VT), and increases as the difference increases.

Generally speaking, however, if the VT is lower than about 0.4 V, a direct subthreshold current, which exponentially increases with the drop in VT, will flow through the MOS transistor which should intrinsically be cut off. As a result, the direct current greatly increases in a semiconductor integrated circuit composed of a number of MOS transistors, even if the circuit is a CMOS circuit. Hence, the direct current is a significant problem for future semiconductor integrated circuit design, in which high speed, low power consumption, and low voltage operation are important. Specifically, the subthreshold currents accumulate to establish the large direct current in the entire chip. Thus, the VT of the cross-coupled transistors of the static memory cells cannot be reduced below about 0.4 V. Therefore, the effective gate voltage can only decrease as the operating voltage decreases. As a result, the margin of the memory cells is narrowed or the operating speed is lowered, becoming more susceptible to influences of VT variation during fabrication, caused by dispersion.

FIG. 2 shows a memory cell for illustrating the problems of the prior art, and a waveform timing chart for explaining these problems in more detail.

The memory cell of FIG. 2 is exemplified by a CMOS-type static memory (SRAM). The memory cell is said to be "inactivated" when data are stored such that a word line (WL) is at a low level of 0 V, a data storage node N2 in the cell is at a high level equal to the supply voltage VCC of 1 V, and another data storage node N1 is at a low level of 0 V. In the prior art, the threshold voltage VT of all transistors of the memory cell is greater than 0.4 V so that both an N-channel MOS transistor QS2 and a P-channel MOS transistor QC1 are off, because the voltage between the gates and sources of QS2 and QC1 is 0 V. The current flowing through the VCC terminal can thus be neglected, which is why the SRAM is considered to be "low power".

The voltage margin of this memory cell becomes smaller as the difference (VCC−VT) becomes smaller. Thus, the VT must be decreased for a lower VCC. As the VT is lowered below 0.4 V, however, the subthreshold current flows through transistors QS2 and QC2, which should be intrinsically off, and so the subthreshold current exponentially increases as VT decreases. Generally speaking, the VT will disperse with the fluctuation of the fabrication process, and the subthreshold current will increase for higher temperatures. This current will further increase if both the VT dispersion and junction temperature increase are considered.

Moreover, since the subthreshold current flows through all of the memory cells in the chip, a total current as high as 10 mA or larger may flow through an SRAM of, for example, about 128 Kbits. This current is also the data holding current for the entire cell array. This is a serious problem, considering that the data holding current of the ordinary SRAM using MOS transistors having a relatively high threshold voltage so as to suppress the subthreshold current substantially can be made less than 10 µA. To prevent this high aggregate current, therefore, the VT has been set at a relatively high level of 0.4 V or higher.

Some consideration is also given to lowering the VCC, with the VT fixed at 0.5 V, for example. The demand for dropping the VCC comes not only from the low breakdown voltage of the MOS transistors, but also from low power consumption, or drive by a single battery. If the miniaturization of MOS transistors advances so that the channel length is less than 0.5 µm, or that the gate insulator has a thickness of less than 6 nm, the transistor can operate at a sufficiently high speed even with an external supply voltage VCC as low as 1.5 to 1.0 V. Thus, the voltage VCC can be lowered to that extent, with preference given to lower power consumption.

Dropping the VCC, however, decreases seriously the voltage margin of the memory cell, because the effective gate voltage of the conducting transistor QS1 is "VCC−VT", so that the effective gate voltage becomes smaller as the VCC comes closer to VT. This drastically increases the fluctuation ratio of the VT to the dispersion. Moreover, the conventional protection against soft errors will drop together with the margin of the threshold voltage difference (offset voltage) between the cross-coupled paired transistors (QS1 and QS2, QC1 and QC2) in the memory cell to the equivalent noise.

When the memory cell is "activated", speed or operation margin is also reduced if the VT is as high as 0.5 V, with a low VCC. If a VCC of 1 V, for example, is applied to the word line WL, transistors QT1 and QS1 are turned on, so that a small voltage change of 0.2 V is caused by the current flowing through the transistors and the load resistor (composed of MOS transistors) connected to a data line DL. On the other hand, transistor QS2 has a gate voltage that is far lower than the VT and is off, so that no voltage change appears in the other data line /DL. By the voltage polarity of this data line pair, the stored data of the memory cell are discriminated and read out. This discrimination is more stable for a larger change in the voltage appearing on the data line DL. Such a large voltage change requires a high and constant current to flow through QS1 and QT1. However, this current becomes lower as the VCC drops because QS1 and QT1 have substantially equal effective gate voltages of (VCC−VT), and is seriously influenced by the dispersion of the VT.

As described above, the circuit and drive system of the prior art suffers from an extreme increase of the direct current, a drop/fluctuation of operating speed, or a drop in operation margin, as the VCC drops. As a result, the performance of the SRAM chip or microprocessor chip containing an SRAM is seriously deteriorated as the VCC drops.

SUMMARY OF THE INVENTION

An object of the present invention is to suppress the increase in the subthreshold current and the drop of the voltage margin caused by the low voltage operation of the cross-coupled MOS transistor static memory cell, in a static memory or semiconductor integrated circuit in which the static memory is incorporated.

This object can be realized by controlling the voltage of at least one power supply line of a static memory cell having cross-coupled MOS transistors which conduct no substantial current between their drains and sources, even if the gate and source voltages are equal. The voltage difference between the two data storage nodes in the inactivated memory cell may exceed the voltage difference between the two data storage nodes of the cell when a voltage corresponding to write data is applied from the data line pair to the data storage nodes of the memory cell when activated. As a result, the voltage between the two data storage nodes in the memory cell can be made sufficiently high even if the main supply voltage is low when the memory cell is activated, so that the memory cell can be stably operated with low power consumption and a wide operation margin.

BRIEF DESCRIPTION OF THE DRAWINGS

FIGS. 6(a) and 6(b) respectively show a static memory cell array according to an embodiment of the present invention, and a timing chart for the embodiment of FIG. 6(a);

FIGS. 7(a) and 7(b) respectively show a static memory cell array according to an embodiment of the present invention, and a timing chart for the embodiment of FIG. 6(a);

DETAILED DESCRIPTION OF THE PREFERRED EMBODIMENTS

Figure 1A:
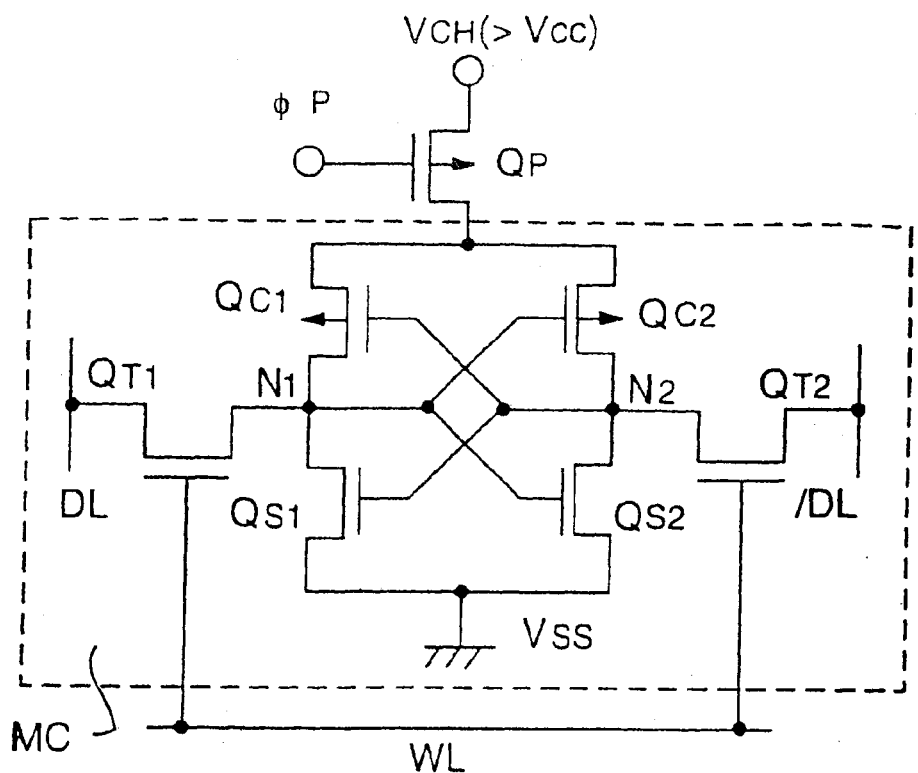
FIGS. 1(a)-1(c) illustrate features of the present invention for controlling the power supply line voltage of a static memory cell.
Figure 1B:
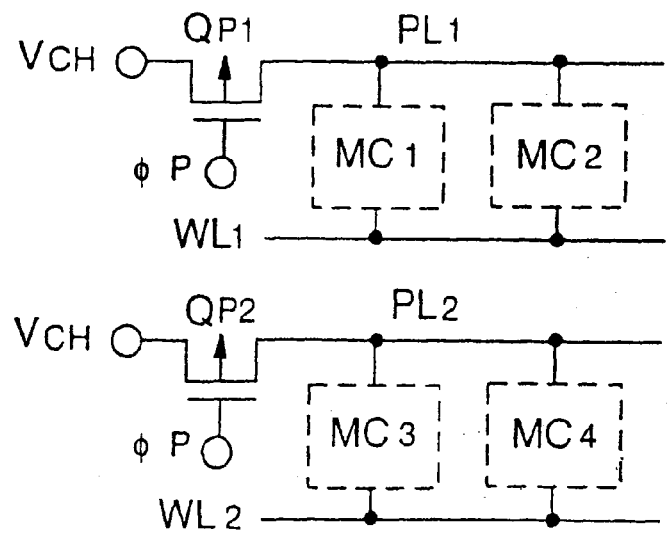
Figure 1C:
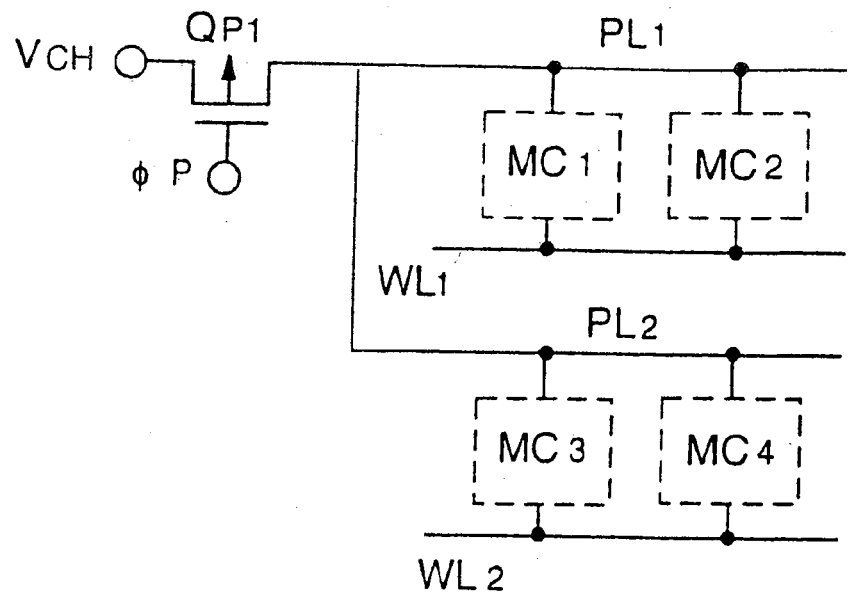

FIG. 1(a) shows an embodiment in which a transistor QP illustrates a means for controlling the connection between an operation voltage point VCH of a semiconductor integrated circuit and a static memory cell, for each such cell in the circuit. FIG. 1(b) shows an embodiment in which the transistor QP is added to each row of a memory cell array. FIG. 1(c) shows an embodiment in which the transistor QP is shared among all cells in the memory cell array.

For simplicity, all of the transistors in the memory cell are assumed to have a threshold voltage VT of 0.5 V. Therefore, no subthreshold current will flow through the transistors if the gate and source voltages are substantially equal.

FIG. 1(a) illustrates a basic concept of the invention. Between the common source of P-channel MOS transistors QC1 and QC2 and the power source VCH (or between the higher power supply node of memory cell MC and the power source VCH) is inserted a P-channel MOS Qp, which acts as a switch. The common source of N-channel MOS transistors QS1 and QS2 or the lower power supply node of the memory cell MC is connected to a reference voltage level VSS (ordinarily at the ground voltage of 0 V).

The memory cell MC, as exemplified herein, is a static memory cell which is composed of MOS transistors having mutually cross-coupled gates and drains, as illustrated. More specifically, the memory cell MC is constructed to include a data storage cell in which the output of one inverter composed of QC1 and QS1 is connected to the input of the other inverter composed of QC2 and QS2, and transfer MOS transistors QT1 and QT2 are connected at data storage nodes N1 and N2, respectively. The arrangement assumes that the power source has a sufficiently high current supplying capability at voltage VCC supplied from the outside, and that the power source for the higher voltage VCH has a low current supplying capability. The power source having the low current supplying capability suffers from a temporary voltage drop when a current flows that is higher than the supplying capability.

When data are to be written in the memory cell from the data line pair, the voltage VCC is ordinarily applied to one of the data lines while the MOS transistor QP is not conducting, whereas a potential of 0 V is applied to the other data line. If the word line voltage is at VCC at this time, the voltage (VCC−VT), as dropped by the threshold voltage of QT1 or QT2, is input to one of the data storage nodes N1, N2, whereas a potential of 0 V is input to the other data storage node. With these settings, however, the data storage voltage (i.e., the voltage difference between the nodes N1 and N2) is VCC−VT, an excessively low level of 0.5 V for VCC=1 V and VT=0.5 V.

After this write operation (that is, after the word line voltage is turned off), QP is turned on to apply a sufficiently high VCH (e.g., 2 V) to the common source. Then, the cross-coupled transistors in the memory cell are enabled to act as a differential amplifier so that one of the nodes N1 and N2 is charged to VCH while the other is left at 0 V. The data storage voltage thus rises from (VCC−VT) to VCH. Note that QP need not be timed with the word line activating timing, but is desirably timed to turn on after the word line voltage is turned off so that no unnecessary current flows from the power source VCH (which has a low current supplying capability) to the data lines (bit lines) DL and /DL through the memory cell.

Incidentally, the data, as written in the nodes N1 and N2 for the time period between the time when word lines are turned off to the time when QP is turned on, are held by the parasitic capacitances of the nodes N1 and N2, respectively. If the memory cell is continuously supplied with VCH by turning on QP for the data holding period or at the standby time after the memory cell is enabled, as described above, the operation margin of the memory cell is extended during this period. Moreover, the operation is fast/stable even at the time of reading the memory cell, because the current driving capability of QS1 or QS2 is improved by the rise of the gate voltage.

Since the writing operation can be performed with QP off, the memory cell is made dynamic by any write data so that it can be written at a high speed with low electric power. If not for the QP (i.e., if VCH were connected directly to the memory cell) or if QP were turned on in the course of the writing operation, current would flow disadvantageously through QP for a long time, requiring higher power, or making difficult the data inversion during a writing operation.

FIG. 1(b) shows an embodiment in which QP is shared among a plurality of memory cells, which reduces the total number of transistors for the semiconductor integrated circuit. When memory cell MC1 is written with QP1 off, as described above, the data line pair forcibly applies the voltage of 0 V to the gate of QC1 of MC1 and the voltage of (VCC−VT) (0.5 V) to the gate of QC2, for example. As a result, QC1 is turned on, so that VCH (held by the parasitic capacitance of the common power supply line) is discharged to (VCC−VT).

At this time, a memory cell MC2 on the same word line WL1 is substantially in a reading operation, but the stored data of MC2 are not affected, even though the voltage on PL1 drops. The data storage voltage of MC2 only drops from VCH to the voltage of PL1 or to (VCC−VT). The sensitivity of the differential amplifier in the memory cell is determined to about 0.2 V or lower by the offset voltage of the pairing transistor, and the voltage (VCC−VT) exceeds that sensitivity; thus, the data are not broken. Specifically, if QP1 is turned on after the end of the writing operation, applying VCH to PL1 again, the stored voltage of MC2 assumes the voltage VCH in the same manner as MC1.

In this embodiment, only one power feeding line corresponding to the activated word line may be charged to VCH. Since the remaining, numerous, power supply lines (e.g., PL2) are left at VCH, no charging operation begins even if the corresponding charge transistor (QP2) is turned on. In short, the charge on the power supply lines is localized to reduce power consumption.

FIG. 1(c) shows an embodiment in which the charged transistor QP is shared among all memory cells, so that the degree of integration is further improved over the integration of the foregoing embodiments. In this case, however, the voltages of all power supply lines drop, including those of the memory cells at the inactivated word line. Hence, the charge/discharge power for charging those memory cells to VCH may be increased, or the operation speed may be lowered. However, the area for the memory cells can be reduced if the power supply lines adjoining the word lines are shared, because the number of wiring lines of the memory cells is effectively decreased by consolidating the power supply lines (PL1 and PL2 in FIG. 1(b), for example) under control of a single transistor.

A circuit construction in which the higher power supply node of the memory cells of an SRAM is equipped with switch MOS transistors is disclosed in Japanese Patent Laid-Open No. 60-38796 and Japanese Patent Laid-Open No. 2-108297. However, these disclosures are different in concept from the present invention because the voltage level to be connected through the switch MOS is fed to the device itself.

The following embodiments refer primarily to FIG. 1(b). Both write operations and read operations will be described.

Figure 3:
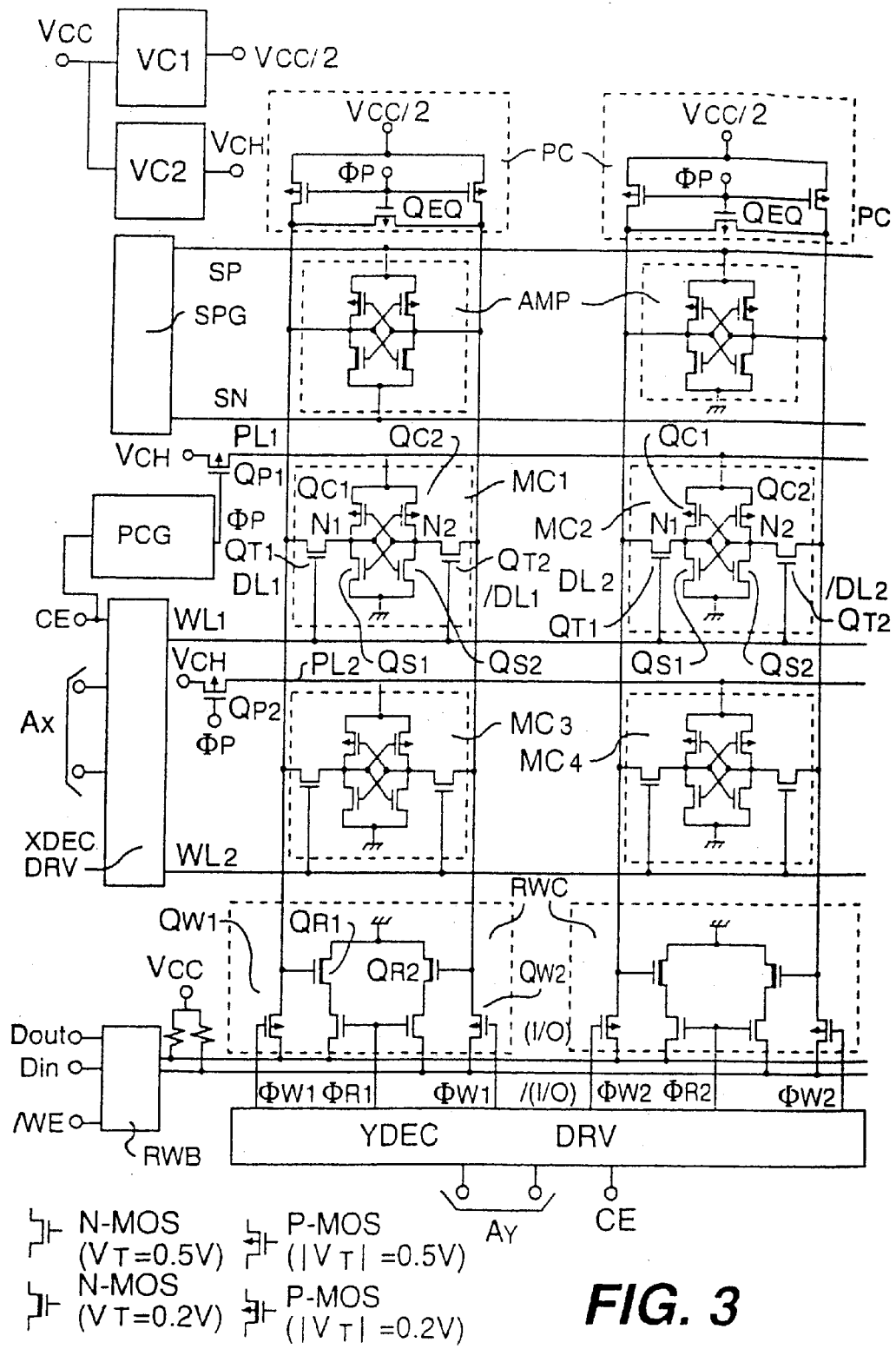
FIG. 3 shows an embodiment of a static memory cell array.
Figure 4:
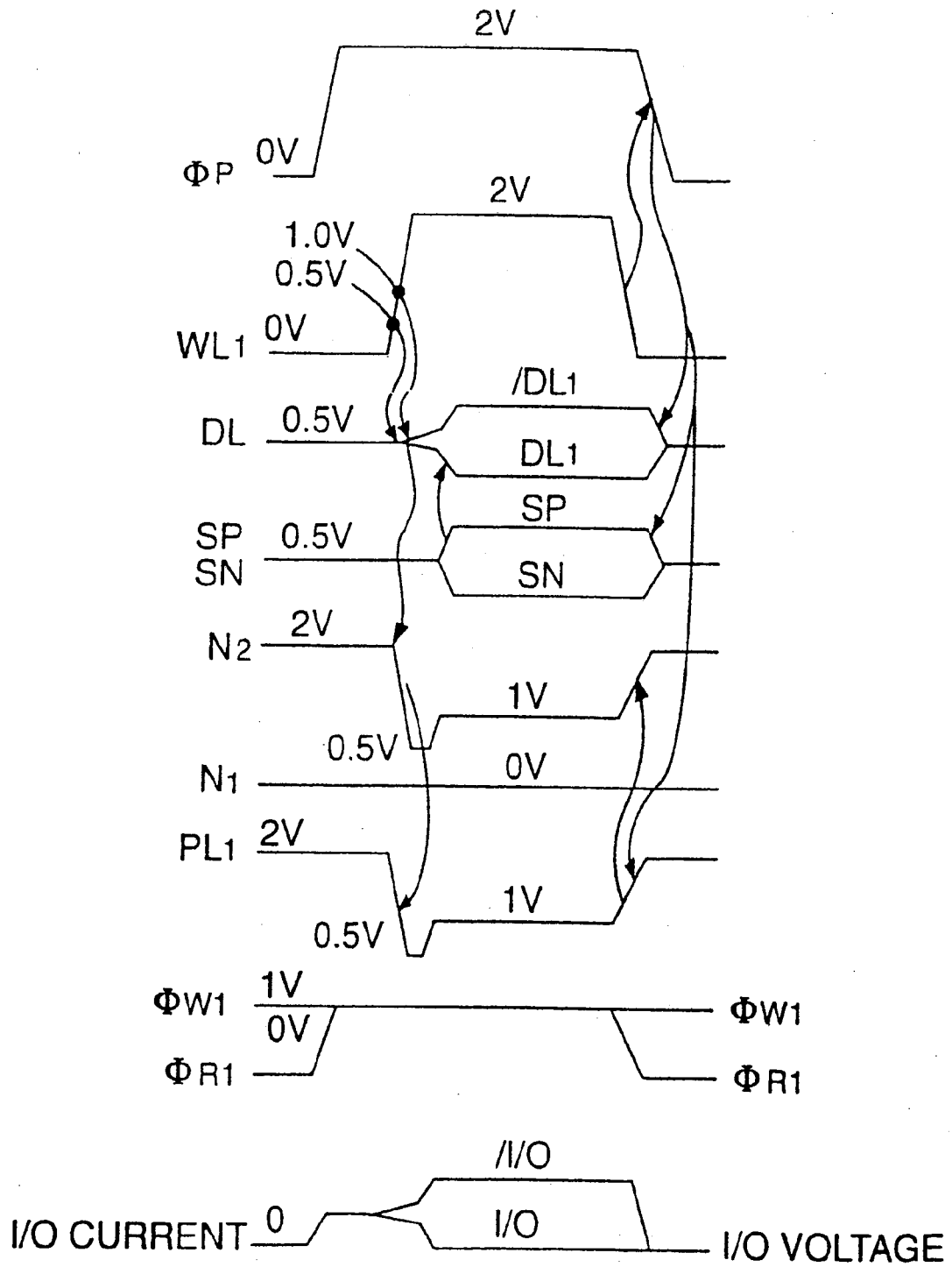
FIG. 4 is a timing chart illustrating a reading operation of the embodiment shown in FIG. 3.
Figure 5:
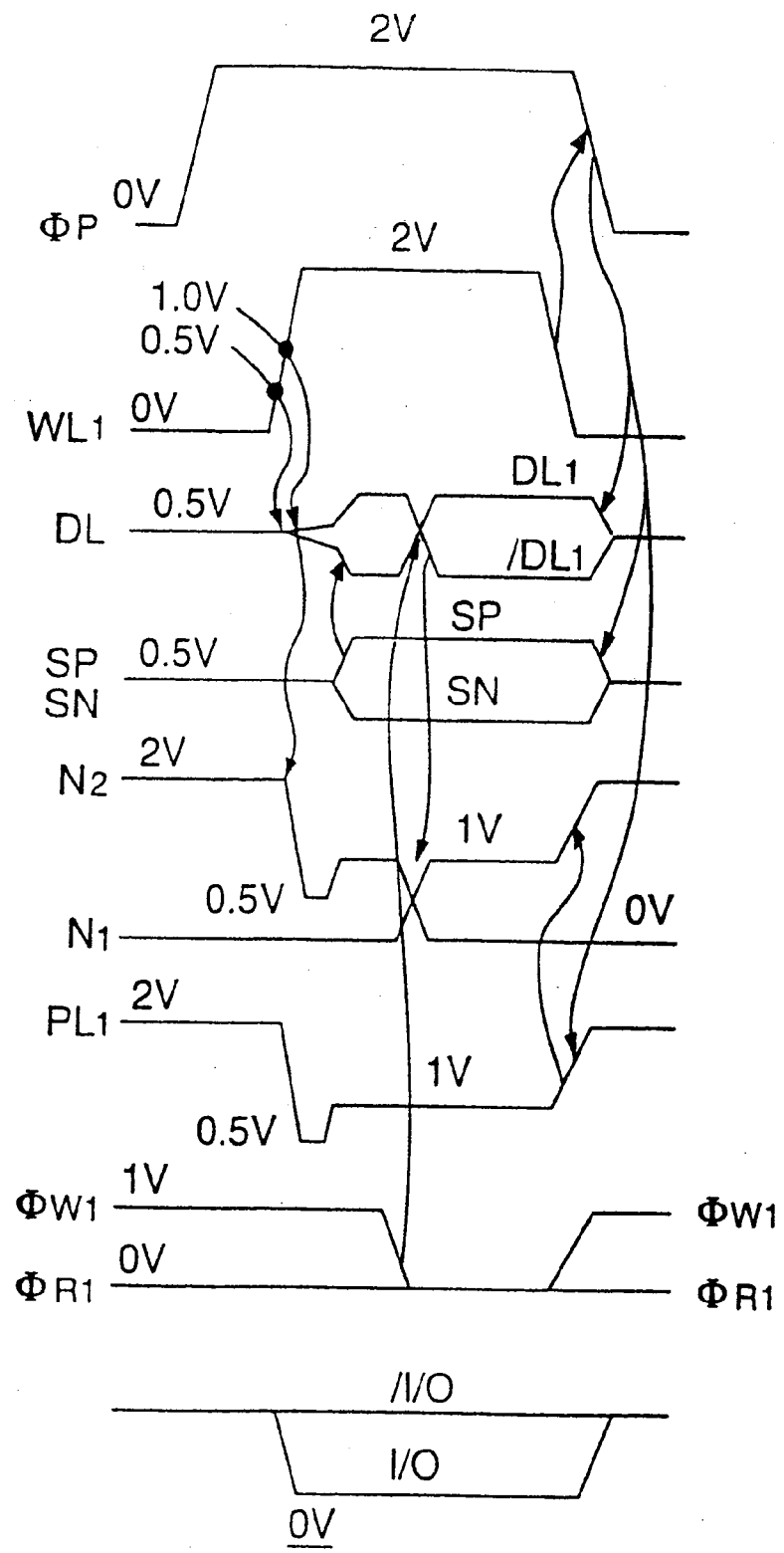
FIG. 5 is a timing chart illustrating a writing operation for the embodiment of FIG. 3.

FIG. 3 is a circuit diagram of an embodiment of the present invention, FIG. 4 is a timing chart for a read operation of the FIG. 3 embodiment, and FIG. 5 is a timing chart for a write operation of the FIG. 3 embodiment.

The memory cell is exemplified by a flip-flop type cell composed of P-channel MOS transistors and N-channel MOS transistors. The threshold voltage VT of all transistors in the cell is set to a high level, such as 0.5 V, such that the subthreshold current can be substantially neglected. For simplicity, a 4-bit cell array is described, with VCC=1 V and VCH=2 V, and assuming that the SRAM is driven by a single battery power source of voltage VCC. Thus, the present embodiment has the following characteristics:

(1) The voltages of the cell power supply lines (PL1 and PL2) are switched according to the operation timing of the cell. Specifically, the voltage of the power supply line of each cell is controlled such that the data holding voltage (e.g., 2 V in the FIG. 3 embodiment), when the cell is not activated, is determined by the voltage which is applied from the power supply lines of the cell, and such that the voltage level is higher than the write voltage to be written in the cell from the data lines when the cell is activated.

(2) The data lines (DL1, /DL1, DL2, and /DL2) operate with reference to a substantially intermediate voltage (i.e., VCC/2=0.5 V) of the maximum voltage (e.g., VCC=1 V in FIG. 3) that can be assumed by the data lines. As a result, the power for charging/discharging the data lines is halved.

(3) The amplitude of the pulse voltage of the activated word line exceeds the maximum voltage that can be assumed by the data lines. In order to eliminate the influence of the threshold voltage VT of the activated transistor connected to the word line, the amplitude of the pulse voltage is set by a voltage boosting circuit in the chip, to a level (VCH) higher by at least VT than the maximum voltage of the data lines. Moreover, the current driving capabilities of QT1 and QT2 can be improved to speed up the operations by the boosted level.

A portion of an SRAM or the SRAM chip itself (together termed an "SRAM") to be incorporated in a microprocessor chip is disabled by an SRAM enable signal CE. The main portion of the SRAM is precharged by a precharge signal ΦP. For example, the power supply lines (PL1 and PL2) of the memory cell are precharged to the voltage VCH, which has been generated by boosting on-chip the external supply voltage VCC. The drop of the data storage voltage in the cell, as caused by a fine leak voltage in the cell, is blocked by compensation currents from P-MOS QP1 and QP2, so that the data storage states of the individual cells are held.

In this example, VCH is generated by a voltage converter VC2. The voltage VCH is generated to boost the voltage VCC in the chip by using a charge pump circuit for driving the capacitor, so that the current driving capability is accordingly low. However, the threshold voltage of the transistors in the cell is set sufficiently high (e.g., 0.5 V or higher) so that the total of the leak currents of the cell, even for an SRAM having a capacity as high as megabits, can be lowered to a sufficiently low level, such as 10 μA or lower. As a result, the compensation currents can be fed to all memory cells from the VCH voltage boosting circuit. Details of a voltage boosting circuit may be found by reference to pages 310-328 and pages 351-371 of "VLSI Memory" (issued by BAIFUKAN in November, 1994). An on-chip voltage boosting circuit, which is suitable for the present invention and operated by a very low-voltage power source (such as 1 V), may be found by reference to pages 75-76 of "1995 Symposium on VLSI Circuits; Digest of Technical Papers". The disclosures of these two documents are hereby incorporated by reference.

The threshold voltage of the MOS transistors to be utilized in the voltage boosting circuit of this latter publication is set to about 0.6 V, such that a voltage boosting circuit that is operable at a lower voltage, such as the supply voltage VCC, may be provided if MOS transistors having lower threshold voltages are used. When transistors having lower threshold voltages are employed, care should be taken with regard to the subthreshold current. However, the leakage current by transistors constituting the voltage boosting circuit is small, since the transistors are relatively small in number. See also Pelley, III, U.S. Pat. No. 5,303,190, which discloses a circuit construction in which the voltage boosting circuit is connected to the higher power supply node of the SRAM memory cell. The voltage level of the voltage boosting circuit or its external supply source is connected to the power supply node.

For the precharge period during which the SRAM is disabled by the signal CE, the individual data lines (DL1, /DL1, DL2, and /DL2, wherein the inverted signal of the paired complementary signals is designated by a slash) are precharged to VCC/2 by the precharge circuit PC. Thus, the voltage amplitude of the data lines can be halved as compared with the VCC precharge of the prior art. The halved data line voltage eliminates the prior art problem of simultaneous writing time of multibit data, because the data line charging/discharging power is halved.

The precharge voltage VCC/2 is preferably generated from the VCC source by the voltage converter VC1, as is seen by reference to FIG. 4.60, page 324, of the "VLSI Memory" publication mentioned above. This level VCC/2 is prepared in the chip so that it generally has a low load current driving capability. If one of the data line pair is precharged directly from zero to VCC/2 by the VCC/2 power source at the precharging time, a sufficient charge current cannot be supplied, which causes a fluctuation in the level VCC/2. This fluctuation is problematic because the number of paired data lines is usually as many as 64 or 128 or larger.

Thus, each data line is equipped with an amplifier AMP, as shown in FIG. 3. This amplifier AMP quickly amplifies the fine differential voltage, appearing on the data line pair at the cell reading time, to VCC. As a result, one of the paired data lines assumes the voltage of 0 V, while the other takes the voltage VCC.

In the next precharge operation, a transistor QEQ is turned on to equilibrate the data line pair automatically to VCC/2. Therefore, a high charge current need not be supplied from the VCC/2 power source. A nonfluctuating current is required to suppress the data line pair from fluctuating in voltage level due to the fine leak current if the precharge period is long. As a result, the packaged VCC/2 power source circuit can be utilized if the AMP circuit is used.

With additional reference to FIG. 4, data are read out from the memory cells as follows. When the SRAM is enabled by the SRAM enable signal CE so that a word line (e.g., WL1) is activated and fed with a VCH pulse, all of the cells (MC1 and MC2 in this embodiment) on the word line WL1 are enabled. In response to a row address signal AX, the activate signal pulse of that word line is generated by a row address decoder XDEC and driver DRV. If the nodes N1 and N2 in the cell MC1 are stored with 0 V and 2 V (VCH), respectively, QT1 and QS1 are turned on to discharge the data line DL1 gradually to 0 V. Since the gate voltages of QS2 and QC2 are substantially at 0 V, the current flows through QC2 and QT2 so that the data line DL1 rises slightly from 0.5 V (VCC/2). Because it takes a long time for this slight differential voltage appearing in the data line pair to rise sufficiently, the pulse is applied to drive lines SP and SN of the amplifier AMP to amplify the data lines DL1 and /DL1 quickly to 0 V and 1 V, respectively.

The degree of integration of the SRAM and the subthreshold current are not seriously affected by the AMP compared to the cells; therefore, the size of the transistors in the AMP can be selected to be larger than those in the cells, and the threshold voltage of the AMP transistors can be set to a level as low as about 0.2 V, so that fast amplification can be achieved. Moreover, the AMP is enabled by an amplifier driving circuit SPG when the memory cell is activated and the drive lines SP and SN are held at the same voltage level when in the "unable" (or standby) state, so that the subthreshold current raises no problems. Moreover, the AMP operates even when the data line pair voltage level is at about 0.5 V.

The voltage difference of the data line pair, sufficiently amplified as described above, is output to the I/O line pair by a read activate signal ΦR1 of the column address decoder YDEC and driver DRV, so that the output becomes a data output DOUT through a read/write buffer circuit RWB. In FIG. 3, transistors QR1 and QR2 convert the voltages of the data line pairs into currents. If these transistors have threshold voltages of 0.5 V, the current flows through the I/O line, because the data line DL1 has a voltage of 0 V, but not through the /I/O line because the /DL1 has a voltage of 1 V. The line through which the higher current flows can be detected within the RWB in the polarity discrimination shape of the differential current or voltage by utilizing a resistor R, as shown. Incidentally, if the threshold voltage VT of QR1 and QR2 is sufficiently low, such as 0.2 V, even a slight voltage difference before the amplification of the amplifier AMP can be detected, so that the speed can be accordingly increased, because the mutual conductance is increased for the VT drop so that a higher current can flow.

The node voltage of the memory cell MC1 will be described in detail with additional reference to the reading operation timing chart of FIG. 4. A problem arises if QP1 or QP2 is turned on in the "active" period or if the QP1 or QP2 is eliminated to apply VCH directly to the power supply line PL1 or the like. When VCH is an external voltage having a high current driving capability, a large direct current continues to flow from all cells on PL1, while the voltage is being applied to the word lines, so that the power becomes high. Alternatively, when the power source voltage VCH boosted in the chip is used, as in the present embodiment, the current driving capability of the voltage boosting circuit becomes short, lowering the level of the VCH. As a result, the data storage voltage of the inactivated cells on PL1 also drops. Once the voltages of all power supply lines drop, a long time is required to recover the level of VCH, because the total parasitic capacitance of the power supply lines is high. As a result, the cycling time of the SRAM is retarded.

At the cell disable time, therefore, all power supply lines are forcibly set to VCH (2 V) by the precharge signal ΦP. For the active period, however, the individual power supply lines are disconnected from the VCH generator. The individual power supply lines come into a substantially floating state so that the level of the VCH is held by their parasitic capacitances. When the cell is activated (for the reading operation in this case), the cell node N1 takes the value of 0 V, turning on QC2. Since the sources of these transistors are connected to PL1, the floating voltage of PL1 drops from VCH so that the nodes N1 and N2 are charged to the high level. However, the node N1 remains at 0 V because it is forcibly fixed there by the voltage of DL1. On the other hand, the gate of QT2 (which has the same potential as WL1) assumes the voltage of 2 V, and /DL1 assumes the value of 1 V so that QT2 is turned on. As a result, node N2 continues to be charged by QC2 until the voltages of PL1 and N2 are equalized, so that PL1 takes 1 V. It is thus apparent that the power supply lines to be discharged to 1 V are localized. Specifically, the localized lines are limited to PL1, and PL2 corresponding to the inactivated word line is not discharged, but is left at VCH.

In the preferred embodiment, there are many power supply lines, only one of which is discharged so that the useless charge/discharge power of the prior art is eliminated. Moreover, the power supply lines to be charged by the incorporated VCH generator are localized and reduced to one in number, so that the VCH generator can be simply designed.

In the write operation illustrated in FIG. 5, the cell MC1 is written by applying a differential voltage to the common I/O line pair. In the illustrated example, data inverted from those in MC1 are to be written into MC1. The voltages of 1 V and 0 V are applied to the data line pair DL1 and /DL1, respectively, and further directly to the cell nodes N1 and N2. As a result, the voltage difference of 1 V is written in the nodes N1 and N2.

After the word line WL1 is turned off from 2 V to 0 V, the precharge operation is executed with the signal ΦP. Then, the node voltage difference of 1 V is amplified to 2 V by the amplifications of the cells themselves, because the cell power supply line PL1 is at 2 V. This high voltage becomes the subsequent data holding voltage. In the write operation, the line PL1 must be fed with the voltage VCH after WL1 is turned off to minimize the capacitance to be charged by the VCH generator.

The stored data of the other memory cells MC on the activated word line WL1 are not broken by the foregoing operations. When the memory cell MC1 is read or written, it transfers data to and from the I/O line pair. During this transfer, a reading operation like that of FIG. 4 is performed with respect to MC2 and the data line pair DL2 and /DL2 because the activate pulse is always applied to the line WL1 of the cell MC2. As a result, if VCH is applied again, even when PL1 is changed from 2 V to 1 V, the two nodes in MC2 are restored to VCH (2 V) and 0 V. Moreover, the stored data in memory cells MC3 and MC4 on the inactivated word line WL2 are not adversely affected in the least. At most, only a negligible junction leak current, if any, flows through the transistors in MC3 and MC4, because the threshold voltage VT is sufficiently high to prevent a subthreshold current. Thus, the voltage VCH at the precharge time is held in the power supply line PL2.

The amplitude of the pulse voltage of the activated word line is VCC and, if the maximum (VD) to be taken by the data lines is set to (VCC−VT) or less, the word voltage need not be generated from the voltage boosting power source VCH. In addition, the influence of the threshold voltage VT of the transistors QT1 and QT2 in the memory cell can be eliminated at the cell writing time or the like, so that the design can be facilitated. FIGS. 6(a) and 6(b) show an embodiment of this case.

FIGS. 6(a) and 6(b) respectively show a circuit diagram and a waveform timing chart for the portion of the FIG. 3 embodiment relating to the memory cell driving system. However, the embodiment of FIGS. 6(a) and 6(b) is different from FIG. 3 with respect to the precharged circuit PC and the read/write circuit RWC. Moreover, the signal level of the word line is set to the reference voltage level of 0 V and the supply voltage VCC, and the higher power supply node of the inactivated memory cell is set to VCH (2 VCC) in the present embodiment, whereas the lower power supply node of the memory cell is set to the reference voltage level of 0 V. On the other hand, the precharge voltage of the data lines is set to a level that is higher than the reference voltage level by at least the sensitivity voltage of the memory cell. The sensitivity voltage, or "sensitivity", of the memory cell may be defined as the minimum voltage difference necessary for inverting the state of the data storage cells or the flip-flop circuit by the voltage difference which is applied between the lines DL and /DL of FIG. 1, for example.

In order to exemplify the sensitivity voltage with respect to the voltage difference between DL and /DL, the precharge voltage of the data lines may be one-half or more of the sensitivity voltage. Since the sensitivity voltage of the memory cell is usually lower than 0.2 V, a reference voltage level VR is set to 0.2 V to afford a margin, and the precharge voltage level of the data lines is set to 0.2 V. In other words, the maximum of the voltage amplitude to be assumed by the data lines according to this embodiment is reduced to the low voltage VR near the sensitivity voltage of the memory cell itself, or lower than the threshold voltage VT (0.5 V). The voltage amplitude of the data lines of the memory cell is minimized so that the low-power operations can be performed at a correspondingly high speed. As a result, the data line pair can be precharged by the reduced voltage power source, which is illustratively composed of a comparator using QL1 and VR as shown. The data storage voltage level of the memory cell can be sufficiently developed to VCH (2 V).

The reading operation according to this embodiment will be described with additional reference to FIG. 6(b). Initially, all of the cell power supply lines are precharged to VCH by the precharge signal ΦP. At the end of this precharge operation, a pulse having the amplitude VCC (1 V) is applied to the activated word line WL1. If the nodes N1 and N2 in the cell are at 0 V and VCH, for example, QT1 is turned on to discharge data line DL1 from 0.2 V to 0 V. Since QT2 is on but QS2 is off, the charge of the node N2 is distributed to the other data line /DL1 so that the line /DL1 slightly rises from 0.2 V to ⅌. This rise is slight because the data line capacitance is 100 times or more as large as the in-cell node capacitance.

At this time, the voltage of the node N2 is discharged from 2 V to $\mathcal{V}$. The differential voltage thus appearing in the data line pair is extracted as the cell reading data from the I/O line pair through the read transistors QR1 and QR2. In order to achieve a large gain, P-channel MOS transistors are preferably used for QR1 and QR2. By this series of operations, power line PL1 finally drops to $\mathcal{V}$.

When the precharge operation is next started, however, the value $\mathcal{V}$ is higher than the sensitivity of the cell itself, so that $\mathcal{V}$ is normally amplified to VCH by the cross-coupled P-channel MOS transistors QC1 and QC2. If the voltage difference $\mathcal{V}$ between the nodes N2 and N1 is smaller than the sensitivity, however, $\mathcal{V}$ is not normally amplified at the precharge time, and the inverted data may be held.

Incidentally, the writing operation is performed by applying a differential voltage of 0.2 V to one of the paired data lines, as selected from the I/O line pair, and a voltage of 0 V to the other data line, and then by setting the power supply line PL1 to 2 V by a precharge operation as in the reading operation.

FIGS. 7(a) and 7(b) show an embodiment in which a high data storage voltage is achieved by pulse-driving the higher and lower power supply nodes of the memory cell at the precharge time. FIG. 7(a) is a circuit diagram, and FIG. 7(b) is a waveform timing chart corresponding to the circuit diagram. FIGS. 7(a) and 7(b) thus relate to the memory cell driving system of the entire SRAM, and the illustrated embodiment differs from that of FIG. 3 in that the lower voltage level of the memory cell can be changed depending upon whether the memory is activated. More specifically, the lower power supply node of the memory cell is set, when inactivated, to the reference voltage level of 0 V and, when activated, to a voltage level that is dropped by at least the sensitivity voltage level of the memory cell from VCC/2. In this embodiment, moreover, the signal level of the word lines is set to the reference voltage level of 0 V and the supply voltage VCC, and the precharge voltage level of the data lines is set to VCC/2. However, the higher power supply node of the inactivated memory cell is set to VCH (2 VCC).

Although the precharge voltage of the data lines is as low as 0 V in the embodiment of FIGS. 6(a) and 6(b), the present embodiment is featured in that the precharge voltage of the data lines is at VCC/2. Thus, the read transistors QR1 and QR2 of FIG. 6(a) are replaced by N-channel MOS transistors suited for higher operations. Moreover, amplifications can be made at a higher speed because two kinds of amplifiers (QS1 and QS2, and QC1 and QC2) in the cell are enabled at the initial stage of the precharge.

Assuming that VCH=3 V, VCC=1.5 V, VT=0.5 V, and VR=0.2 V, and further that a VCC/2 precharge circuit PC like that of FIG. 3 is connected to each data line pair, all data lines are set to 0.75 V, the power supply lines (PL1, etc.) are set to 3 V, and the power supply lines (PL1', etc.), which are connected to the N-channel MOS transistors, are set to 0 V, because a transistor QL2 is cut off for the precharge period by a transistor QL3 so that the line PL1' is set to 0 V by a transistor QL4. Moreover, the nodes N1 and N2 in all cells are set to 3 V or 0 V in accordance with the stored data.

After the end of the precharge period, the line PL1 is held at 3 V. On the other hand, the line PL1' is developed toward VCC by a resistor R'. When the voltage ((VCC/2)−VR, or 0.55 V) is reached, however, any further rise is suppressed by the comparator using the voltage of ((VCC/2)−VR) as the reference voltage in the voltage limiting circuit composed of QL2.

At the same time, the lower node N1 takes 0.55 V. Resistor R' is set at a relatively high resistance to suppress the power consumption, but can be replaced by a MOS transistor.

When the word voltage develops, transistors QT1 and QS1 are turned on because the node N1 is at 3 V, whereas the node N1 is at 0.55 V, so that the data line DL1 is discharged. With the difference VR between the lines DL1 and PL1', therefore, the line DL1 is finally discharged to the voltage 0.55 V of the line PL1'. Since QS2 is off, on the other hand, the charge on node N2 is released through QT2 to the line /DL1, as described above, and the node N2 and the line /DL1 takes substantially equal voltages of (0.75 V+$\mathcal{V}$). This voltage difference, appearing on the data line pair, is extracted to the I/O line pair through the activated read circuit connected to each data line.

By the subsequent precharge, the voltage difference of about 0.2 V between the nodes N1 and N2 is amplified quickly to 3 V. When the line PL1' assumes 0 V, both QS1 and QS2 are turned on because N1 has been at 0.55 V, whereas N2 has been a voltage level slightly higher by V than 0.75 V, so that a voltage difference of about 0.2 V between N1 and N2 is amplified by the cross-coupled amplifiers QS1 and QS2. This voltage difference is also amplified by the other cross-coupled amplifiers QC1 and QC2.

In the embodiment of FIGS. 6(a) and 6(b), at the initial stage of the amplification in the cell at the start of the precharge operation, the amplifier composed of QS1 and QS2 is off, and the amplification is carried out only by the amplifier composed of QC1 and QC2. Therefore, the embodiment of FIGS. 6(a) and 6(b) has a rather low speed. However, the present embodiment has a higher speed because both of these amplifiers contribute to the amplifying operation at the initial stage of the amplification.

The writing operation may be performed by applying 0.75 V and 0.55 V to the respective members of the activated data line pair in accordance with the write data. Further, power supply line PL1' is controlled to 0.55 V at the cell activating time as in the reading operation.

According to the present embodiment, the drive can be made even by a VCC/2 voltage generator, packaged in the chip, because the voltage amplitude of the data lines is extremely small (about 0.2 V). As a result, the amplifier AMP of FIG. 3 can be eliminated, so that the chip can be made smaller. Further, since the data line pair operates in the vicinity of VCC/2 at all times, the stress voltage to the transistors for the precharge circuit or the read circuit (QR1 and QR2) on each data line can be halved to improve reliability.

Moreover, the precharge voltage of the data lines need not always be at VCC/2. Instead, the precharge voltage of the data lines may be set to a level higher than the sensitivity of the in-cell amplifier with respect to the PL1' voltage when activated.

Figure 8:
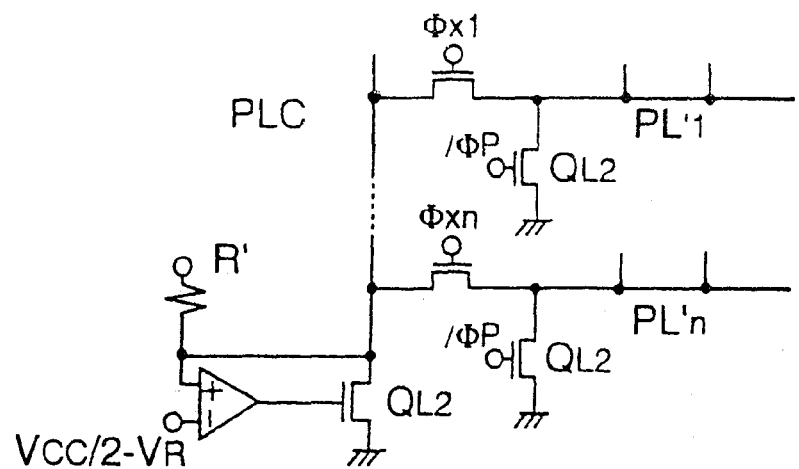
FIG. 8 illustrates an embodiment including a shared power source.

On the other hand, the present embodiment connects the power source circuit constituted by QL2 and QL3 and the comparator to each power source drive line PL' (PL1' and PL2') of the in-cell N-channel MOS transistor because the time period for raising PL1' to 0.55 V is shortened to speed up the access. To reduce the chip size, however, this circuit can be shared with another power supply line as shown in FIG. 8. For the precharge period, the common power supply line PLC is always fixed at ((VCC/2)−VR) by the common power supply circuit, but all of the power supply lines PL1' to PLn' are at 0 V. When PL1' is to be activated, a signal ΦX1 is decoded to 0 V by the external address so that the line PL1' is disconnected from PLC. Afterward, the signal ΦP goes to VCC to discharge the line PL1 to 0 V.

Figure 9:
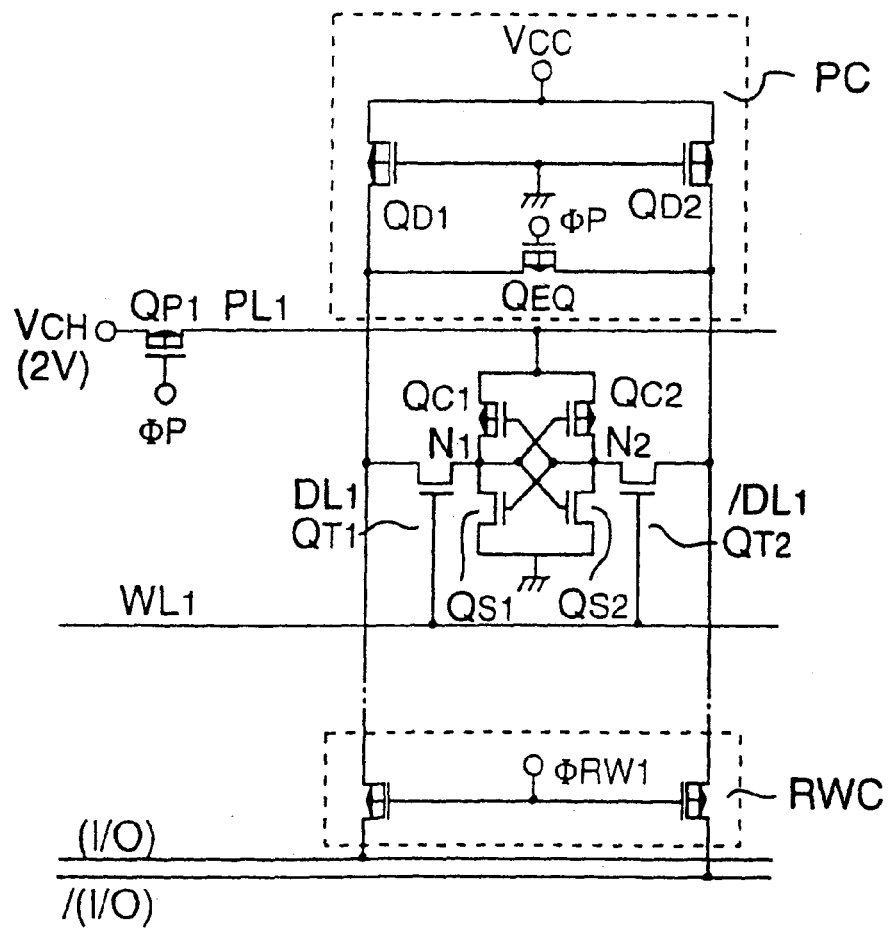
FIG. 9 illustrates another embodiment of a static memory cell array.

FIG. 9 shows an example of applying the teachings of the invention to the memory cell drive system for the entire SRAM, in which the voltage of the data lines takes a level in the vicinity of the VCC at the reading time. The FIG. 9 embodiment is different from that of FIG. 3 with regard to the pre-charge circuit PC and the read/write circuit RWC.

In this embodiment, the signal level of the word lines is set to the reference voltage level of 0 V and the supply voltage VCC, the higher power supplying node of the memory cell when inactivated is set to VCH (2VCC), and the lower power supply node of the memory cell is set to the reference voltage level of 0 V. Moreover, the precharge voltage level of the data lines is set to the VCC.

Each data line is connected to the transistors QD1 and QD2, which act as loads for the activated cell, and to the transistor QEQ, for equalizing the data line pair voltage. This circuit is the precharge circuit PC of this embodiment. Its operations will be described next with reference to the reading timings of FIG. 10.

For the precharge period, the data line pair is at VCC (1 V), and PL1 is at VCH (2 V). Here, it is assumed that the data-line pair DL1 and /DL1 are activated by a column address activate signal ΦRW1 (from 1 V to 0 V) and that the word line WL1 is activated to apply pulses of 0 V to 1 V. If the node N2 is at 2 V, a direct current flows between QD1, QT1, and QS1 so that a slight ratio voltage VS (of about 0.2 V) appears in the line DL1. On the other hand, the node N1 is at about 0 V so that QS2 is off, and QT2 is also off as apparent from its voltage relation. Therefore, no current will flow in the paths between QD2, QT2, and QS2 because the voltage of the node N1 is more or less developed by the ratio action. Thus, the sizes of the transistors in the cell are designed to set that voltage to VT or less.

As a result, the differential signal of VS appears on the data line pair. This voltage is transmitted not through the complicated read circuit, as shown in FIG. 3, but directly to the I/O line pair so that it is read out to the outside, because it is the ratio voltage. Here, QS2 and QT2 are always off so that the charge, as stored in the node N2, is not released. In short, the voltage of PL1 is left at 2 V.

Even if the current driving capability of the VCH voltage boosting circuit, as incorporated in the chip, is not extremely high, no current will flow through the load PL1 of the voltage boosting circuit. As the case may be, therefore, a direct connection can be made by eliminating QP1. However, this elimination can be made only for the reading operation. The elimination of QP1 is difficult for the writing operation, as will be described with reference to FIG. 11.

When a voltage of 1 V is written in one DL1 of the data line pair from the I/O line pair, whereas the voltage of 0 V is written in the other line /DL1, the node N1 in the cell is switched from about 0 V to 0.5 V because the threshold voltage of QT1 is at 0.5 V, whereas the voltage of WL1 is at 1 V. Thus, the node N1 takes the voltage which is dropped by the threshold voltage. On the other hand, the node N2 is switched from 2 V to 0 V because QT2 is turned on, so that the node N2 is discharged to the voltage of the line /DL1. As a result, QC1 becomes more conductive than QC2 so that the line PL1 in the floating state is discharged to the level of 0.5 V, which is forcibly fed from the data line to the node N1. Therefore, the line PL1 has to be charged again to 2 V by the subsequent precharge.

If the line PL1 has a high voltage drop, the corresponding charge has to be supplied by the boosted voltage (VCH) generator to PL1 so that a heavy load is exerted upon the voltage boosting circuit. As a result, the area or power consumption of the VCH generator itself is increased. FIG. 12 shows a load circuit for suppressing the voltage drop to the vicinity of VCC.

Figure 11:
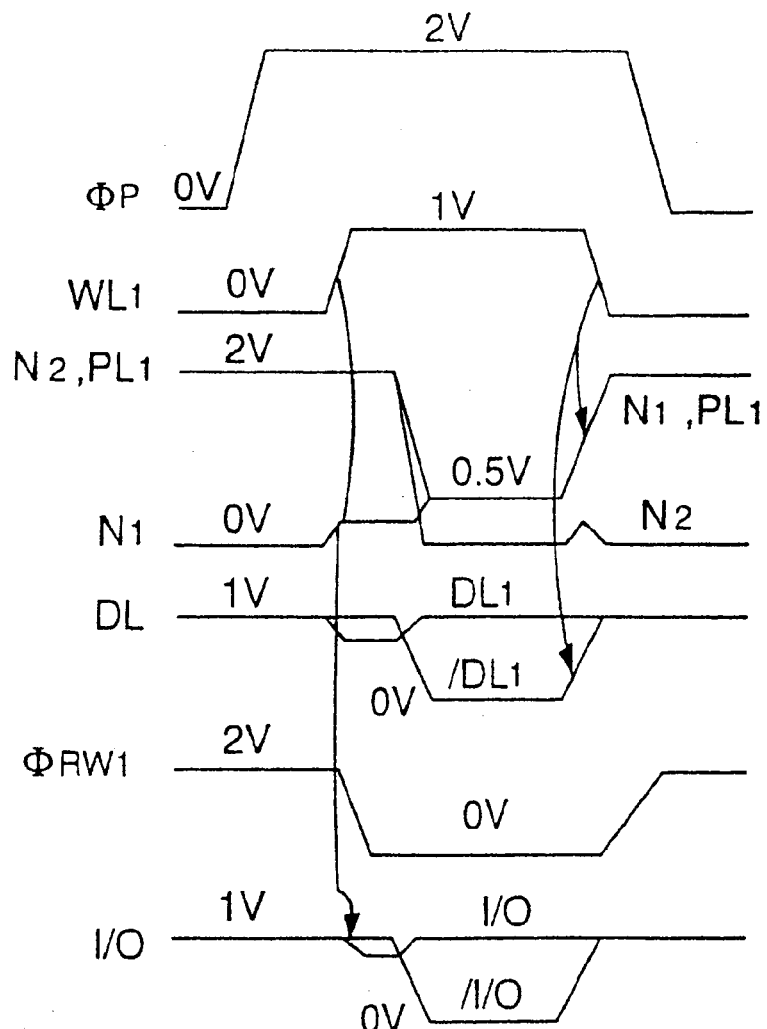
FIG. 11 is a timing chart illustrating a write operation of the embodiment shown in FIG. 9.
Figure 12A:
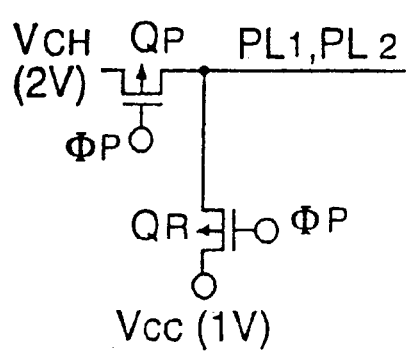
FIGS. 12(a) and 12(b) show power supply line embodiments for preventing a voltage drop.
Figure 12B:
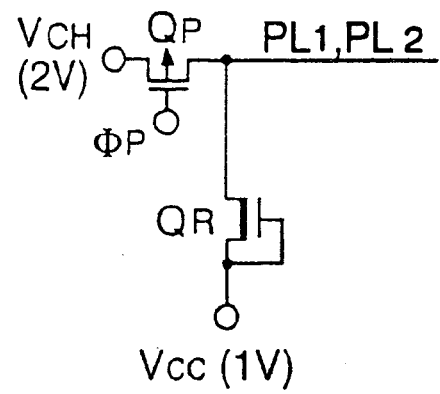

In FIG. 12(a), QP is turned off, but QR is turned on, for the time period in which the cell is activated. The voltage of the power supplying lines is switched from VCH to VCC so that one in-cell node (e.g., N1) is not dropped to 0.5 V, as shown in FIG. 11, but suppressed at VCC (1 V). In FIG. 12(b), the design is simplified by eliminating the precharge pulse /ΦP. The N-channel MOS transistor QR is used, which has a lower threshold voltage (about 0.2 V) than those of the remaining transistors. Because of the diode connection, the transistor is turned on when the voltage of the power supply line becomes lower than (VCC−VT), i.e., 0.8 V or less, so that any further voltage drop can be prevented. In other words, one cell node is not dropped to 0.5 V, as shown in FIG. 11, but suppressed within 0.8 V. This transistor QR prevents, at the pulse timing when the QP is off for a long time, the voltage level of the floating line PL1 from being excessively lowered by the diffusion layer leakage current in the cell, thereby to play a role in extending the voltage margin of the cell.

Figure 10:
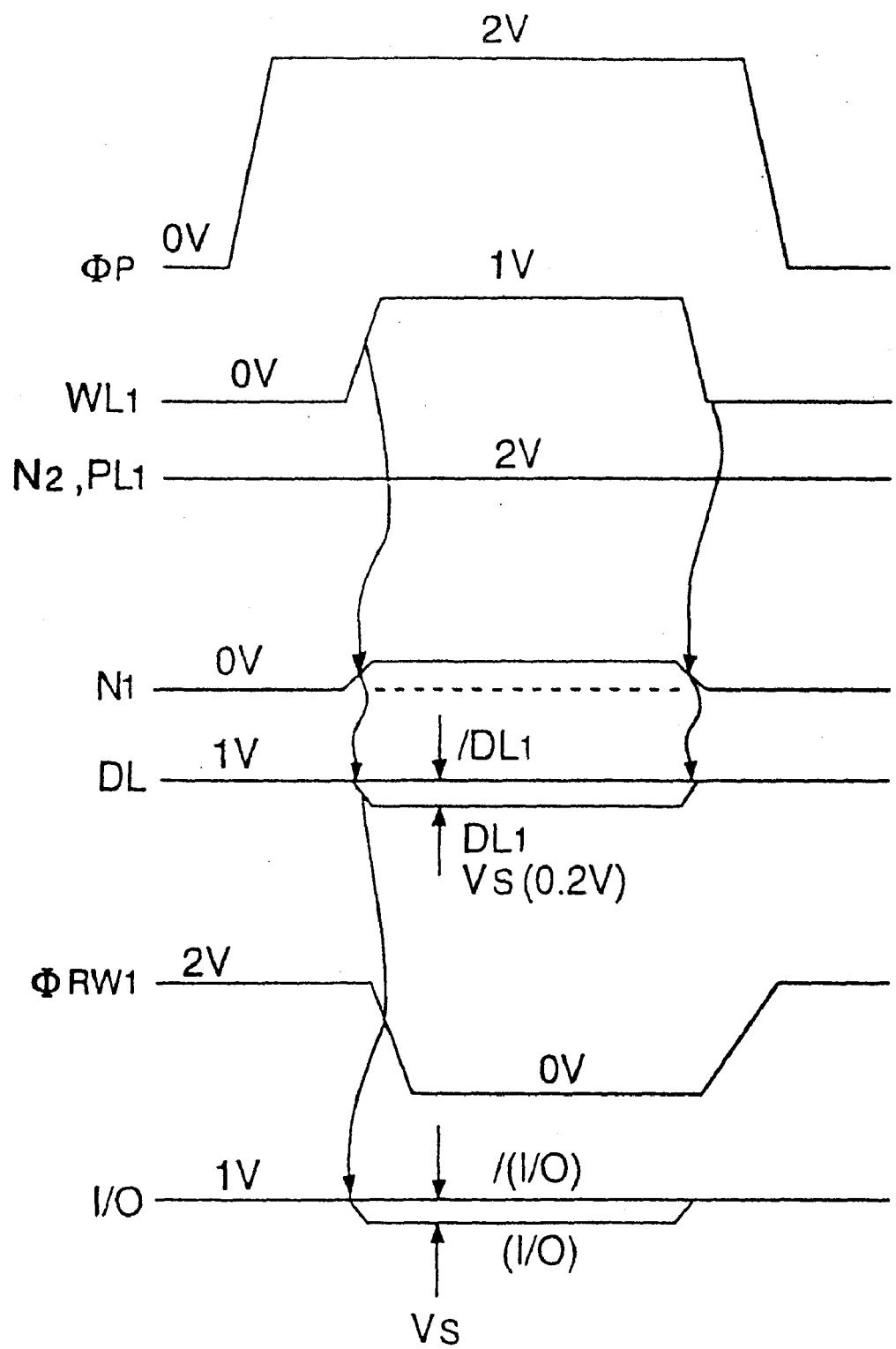
FIG. 10 is a timing chart illustrating a read operation of the embodiment shown in FIG. 9.
Figure 13:
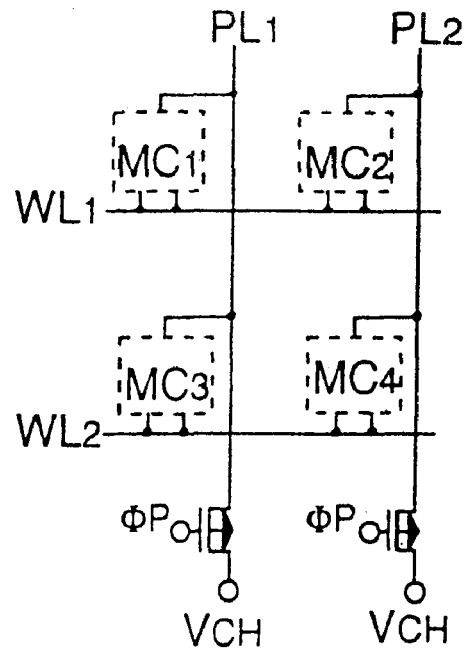
FIG. 13 illustrates an embodiment in which power supply lines and word lines intersect at right angles.

Premising the voltage applications of FIGS. 10 and 11, in addition to the construction in which the word lines and the power supply lines are arranged in parallel as shown in FIG. 9, the word lines WL1 and WL2 and the power supply lines PL1 and PL2 may be orthogonally arranged, as shown in FIG. 13. When the cells on the WL1 are read out, for example, the voltage (VCH) level of all of the power supply lines is unchanged because all of those cells perform operations similar to those of FIG. 10. In the writing operation, however, only the power supply lines belonging to the activated data-line pair are changed.

If the combined pulse voltage of 1 V and 0 V (corresponding to the write data) are applied to the data line pair DL1 and /DL1 (although omitted as apparent from the drawing), the cell MC1 performs an operation similar to that of FIG. 11 so that the voltage of the line PL1 drops from 2 V to 0.5 V. Since the cell MC2 performs an operation similar to that of FIG. 10, the voltage VCH of the line PL2 is unchanged.

Whether the arrangement of the word lines and the power supply lines is parallel or orthogonal depends upon the layout and area of the cells. The construction of FIG. 9 is disadvantageous in that the layout must have different wiring layers so that the power supply lines are not shorted to the data line pair, but is advantageous with regard to the low noise.

If a pulse is applied to the line WL1 to write the cell MC1, such that a large voltage change occurs in the line PL1, a read signal from the cell MC2 appearing on the data line pair DL2 and /DL2 is so fine that the operation of the cell MC2 is seriously susceptible to the influences of noise. Since the data line pair is arranged at a right angle with respect to the line PL1, though, the noise, which is caused through the coupling capacitance by the voltage change in the line PL1, is canceled in the data line pair. Thus, the merits and demerits are contrary in FIGS. 13 and 9. As a result of the voltage fluctuation of the line PL1, for example, a differential noise is made in the adjoining data line pair (DL2 and /DL2). In this case, however, the noise can be canceled if the data line pair is transposed at a midpoint, as is well known in dynamic memory cells.

The foregoing embodiments are premised by generating the voltage VCH in the chip from the power source from which the VCC has been boosted. This is intended to realize a VCC single power source operation that is convenient for the user. However, VCH may be a chip external power source itself, as exemplified by the two external power sources (VCC1 and VCC2) shown in FIG. 14. This chip is assumed to include an input/output interface circuit INTF, and a core CORE such as a static memory SRAM and an arithmetic circuit (e.g., a microprocessor MPU).

In order that the INTF may warrant the existing logic interface level, an element having a relatively large size is operated by the higher voltage (VCC1). On the other hand, the CORE determines the performance (e.g., speed or power) and area of the chip, and its main portion is given a higher performance by using a small-sized element to be operated by the lower voltage (VCC2). The elements in the CORE are generally finer than those in the INTF.

In this chip, VCC1 may be deemed as the VCH in the foregoing embodiments. Thus, the entire chip is operated by the two power sources, but the problem of the output level fluctuation accompanying the internal power source operation is eliminated to facilitate the design.

Figure 14:
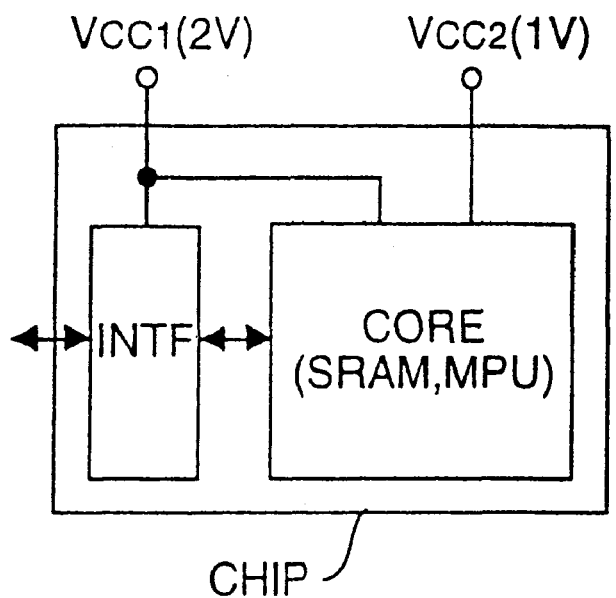
FIG. 14 illustrates and embodiment in which the present invention is applied to a chip powered by two external power sources.
Figure 15:
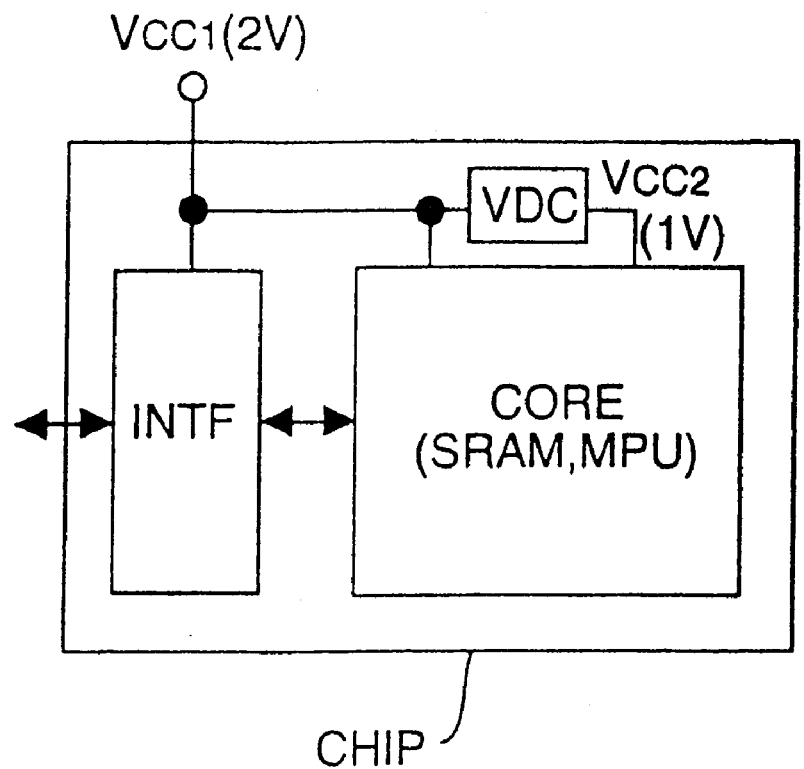
FIG. 15 illustrates and embodiment in which the present invention is applied to a chip powered by a single external power source.

FIG. 15 shows an example in which FIG. 14 is applied to a chip realized with a single power source. In the chip in which the main portion of the CORE is operated by the internal power source (VCC2) dropped from the external single power source (VCC1), the VCC1 may be deemed as the VCH discussed above.

In the foregoing embodiments, the memory cells have been assumed to be of the CMOS type. Since, however, a differential amplifier function in the memory cell is applied, the present invention may have as few as one latch type cross-coupled amplifier in the memory cell. The P-channel MOS transistors QC1 and QC2 may be replaced by the well-known highly resistive polysilicon loads. This is because the nodes N1 and N2 can be developed to VCH so that they can be amplified by the cross-coupled N-channel MOS transistors QS1 and QS2. Moreover, the threshold voltage VT of the N-channel transfer transistors QT1 and QT2 (which have the transfer function in the memory cell) may be lower than the VT of the remaining transistors in the memory cell (such as 0.2 V).

The effective gate voltages and the driving current of QT1 and QT2 are increased by the drop of VT at the activated time so that a fast operation can be achieved. In order to eliminate the subthreshold current through QT1 and QT2 at the inactivated time, however, a bias has to be made such that the word lines, i.e., the gates of QT1 and QT2 in the inactivated state, may be lowered from 0 V to a negative voltage, e.g., −0.2 V. If the gate voltage and the source voltage are designated at VG and VS, respectively, the effective gate voltages of the QT1 and QT2 at the inactivated time are expressed by (VG−VS−VT), i.e., −0.4 V or less for VG, VS, and VT=−0.2 V or less, 0 V and 0.2 V, respectively. If, on the other hand, the minimum of VT at which the subthreshold current can be ignored is 0.4 V, the effective gate voltage of the transistor having a VT of 0.4 V under the normal bias conditions is −0.4 V, for VG, VS and VT=0 V, 0 V and 0.4 V, respectively. As a result, a lower effective gate voltage is applied to the system combining the aforementioned low VT and the negative voltage gate, so that no subthreshold current will flow. In this case, the activated word voltage is pulsating from −0.2 V in the inactivated state to VCC or higher.

Although it has been assumed that the P-channel and N-channel transistors in the memory cell have equal VTs of 0.5 V, this assumption is not essential. Since the N-channel transistor is important for determining the read current to the data lines, its VT is set to the lowest level, e.g., 0.4 V as no problem is raised by the subthreshold current. Since, however, the P-channel transistor has a main role of charging the fine capacitance in the memory cell and may have a somewhat low speed, its absolute value may be set to 0.4 V or higher, e.g., 0.6 V. For simplicity, on the other hand, VCH has been assumed to be two times as high as VCC, but it may be higher than VCC so long as it is lower than the breakdown voltage of the transistor (such as the gate breakdown voltage).

There is another method of charging the power supplying lines at a high speed while the sensitivity in the memory cell is enhanced. The circuit in which the transistors are cross-coupled in the memory cell, as described above, may be deemed as a differential amplifier, and not only the offset voltage but also the capacitance difference between the nodes N1 and N2 exerts an influence upon the sensitivity of the differential amplifier. Depending upon the layout of the memory cell, the capacitance difference may occur if a high density is preferred, and the sensitivity is degraded for a large capacitance difference. In short, immediately before the amplification, a larger voltage difference is required between the nodes N1 and N2.

Figure 16:
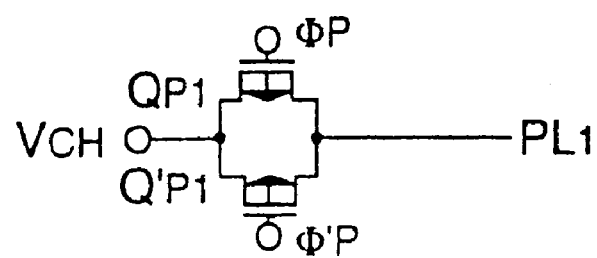
FIG. 16 illustrates a power supply line driving system.

The sensitivity according to that capacitance difference is worse for the higher speed at which the power supplying line (e.g., PL1) is developed to the VCH. This problem can be solved at the two stage amplifications, as shown in FIG. 16. Specifically, two transistors having drastically different channel widths (e.g., ten times) are connected in parallel to each power supply line (e.g., PL1). The signal ΦP is applied to turn on the transistor (QP1) having a small channel width at first, thereby to charge the power supply line gradually. After the amplification is made, and until a large voltage difference is attained between the nodes N1 and N2, a signal ΦP' is applied to turn on the transistor (QP1') having a large channel width to effect the charging operation at a high speed.

Figure 17:
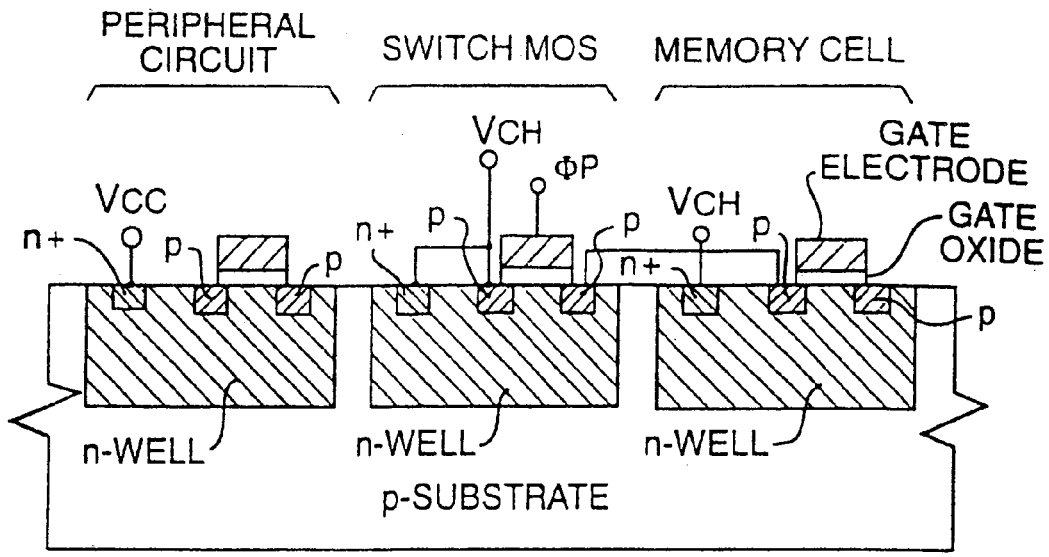
FIG. 17 is a sectional view of an embodiment of the present invention.

FIG. 17 shows a section of an embodiment of the present invention. As embodied in the present embodiment, the switch MOS (QP) and the PMOS transistor of the memory cell are formed in the n-wells, and the potentials of these wells have to be set to VCH so that the source or drain electrodes of those transistors may rise to VCH. At this time, moreover, the substrate may be of the P-type when the potential of the n-well for making the PMOS transistor of the peripheral circuit is to be set to VCC.

Figure 18:
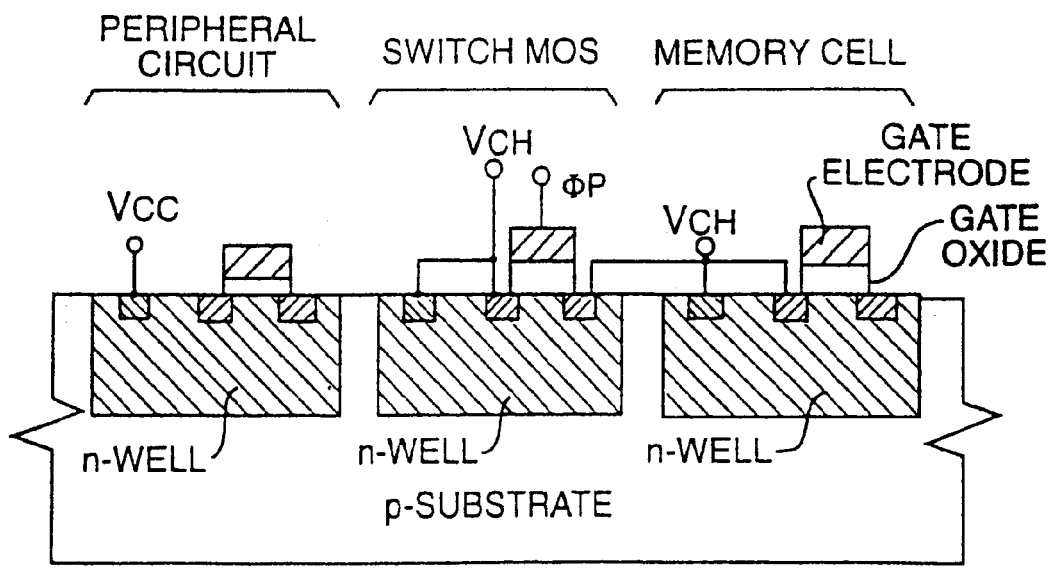
FIG. 18 illustrates a sectional view of another embodiment of the present invention.

FIG. 18 is a section of another embodiment of the present invention. Since the high voltage VCH is applied in the present embodiment to the switch MOS and the PMOS transistor of the memory cell, the breakdown voltages are developed by making the gate oxide of those MOS transistors thicker than those of the peripheral circuit. The MOS transistor of the peripheral circuit has a thin oxide to have a high transconductance so that it can effect operation at a high speed.

Figure 19:
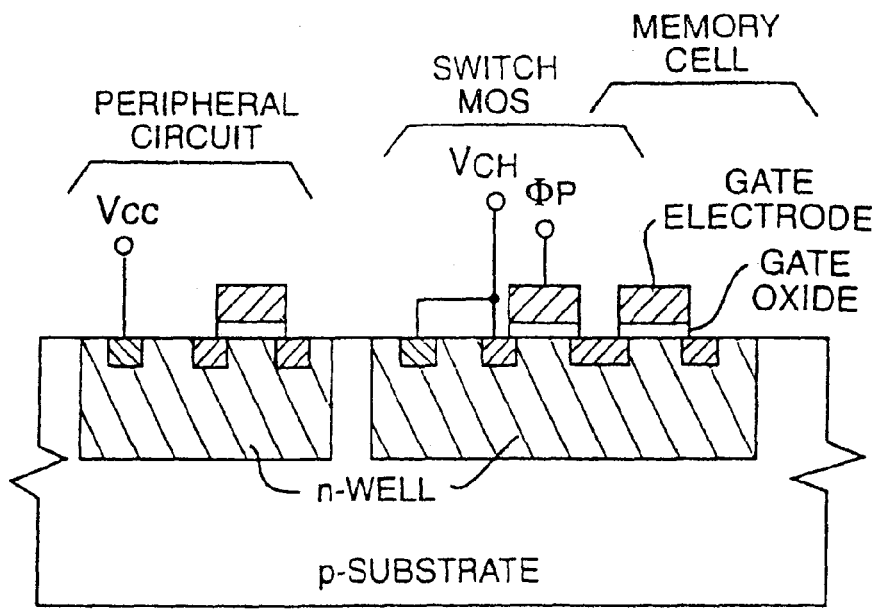
FIG. 19 illustrates a sectional view of yet another embodiment of the present invention.

FIG. 19 is a section of another embodiment of the present invention. In the present embodiment, the switch MOS and the PMOS of the memory cell are not separated as when the switch MOS is attached to each memory cell, as shown in FIG. 1(a). In this case, the wells for forming the two MOS transistors may be set to the voltage VCH.

Figure 20:
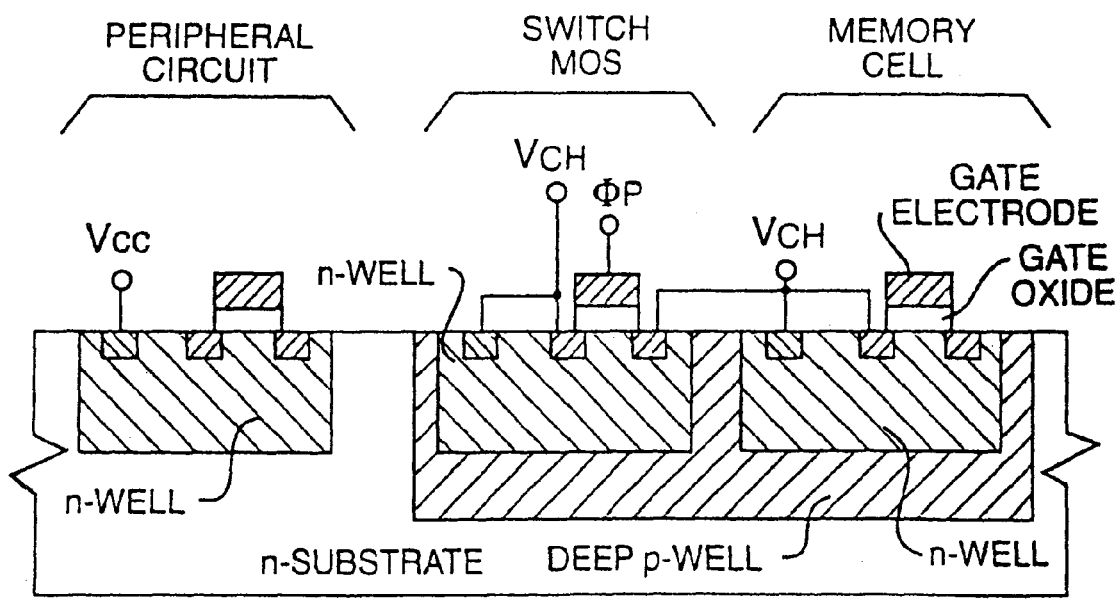
FIG. 20 illustrates a sectional view of still another embodiment of the present invention.

FIG. 20 is a section of another embodiment of the present invention, in which the present invention is formed over an n-type substrate. When the present invention is to be applied to the n-type substrate, the peripheral circuit, the switch MOS and the PMOS of the memory cell cannot be separated. As embodied in the present embodiment, therefore, there is formed in the switch MOS and the PMOS of the memory cell a common deep p-well, in which an n-well can be formed to change the peripheral circuit and the voltage level.

Figure 21:
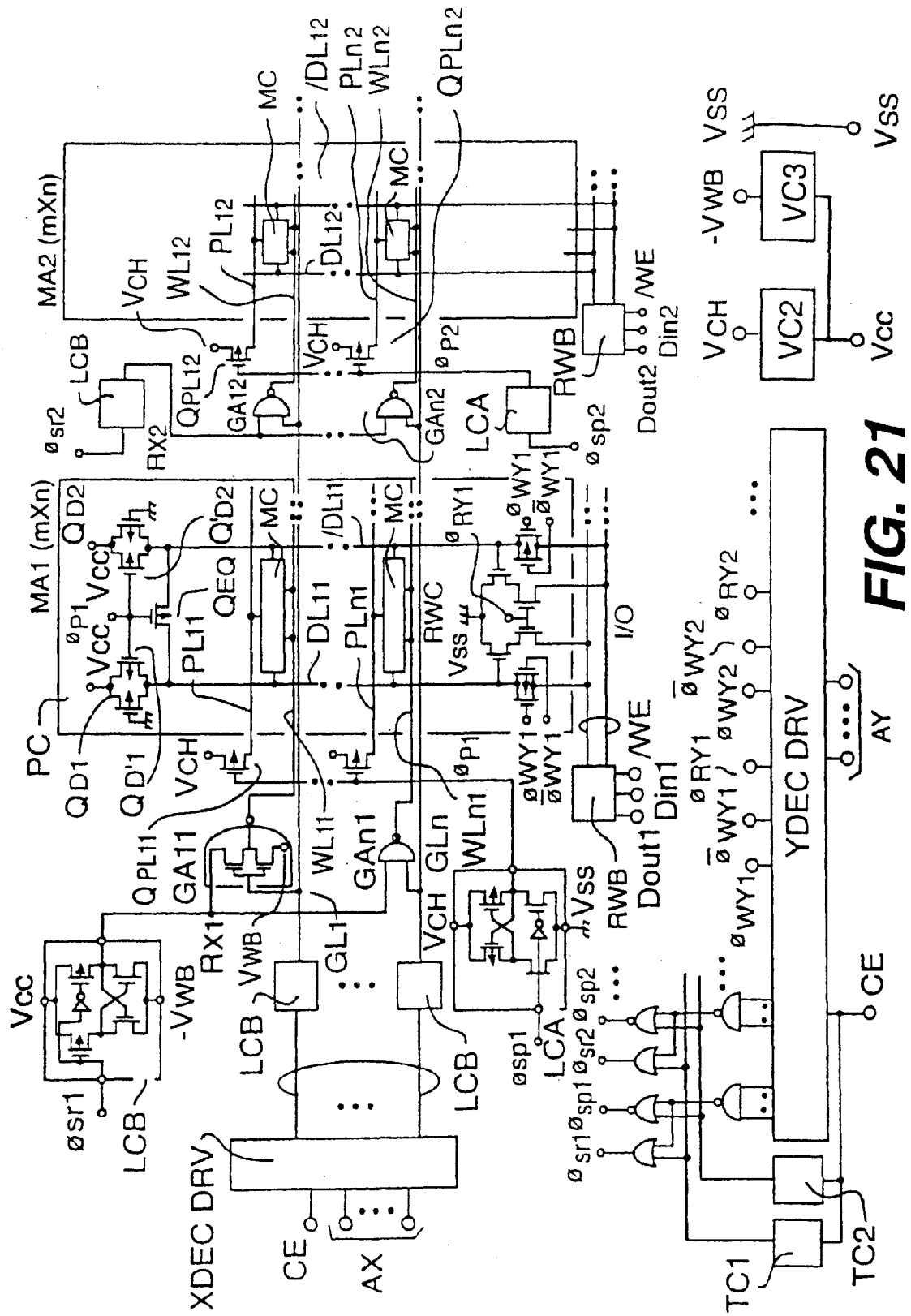
FIG. 21 shows an embodiment in which the invention is applied to a divided memory cell array.

In order to exploit the advantages of the present invention to the maximum, additional devices are desired for the memory array and the peripheral circuit. FIG. 21 shows an embodiment which is applied to the SRAM portion in the chip or to the one-chip SRAM. The memory portion is divided into a plurality of memory arrays (MA1, MA2, - - -). Global word lines (GL1, . . . , GLn) are wired over the plurality of memory arrays. The memory array is composed of a plurality of (m×n) memory cells MC which are arranged in a matrix configuration such that (m) memory cells are arranged in the direction of sub-word lines (WL11, - - -, and WLn1, WL12, - - -, and WLn2, - - -, and so on), whereas (n) memory cells are arranged in the direction of data lines (DL11 and /DL11, - - -, DL12 and /DL12, - - -, and so on). Sub-power supply lines (PL11, - - -, and PLn1, PL12, - - -, and PLn2, - - -, and so on) for applying the boosted voltage VCH to the higher power supplying nodes of the plurality of memory cells through switch MOS transistors (QPL11, - - -, and QPLn1, QPL12, - - -, and QPLn2, - - - and so on) are wired to make individual pairs with the aforementioned sub-word lines. Incidentally, these sub-word lines can be read merely as word lines when they are made to correspond to the aforementioned embodiment.

Figure 22:
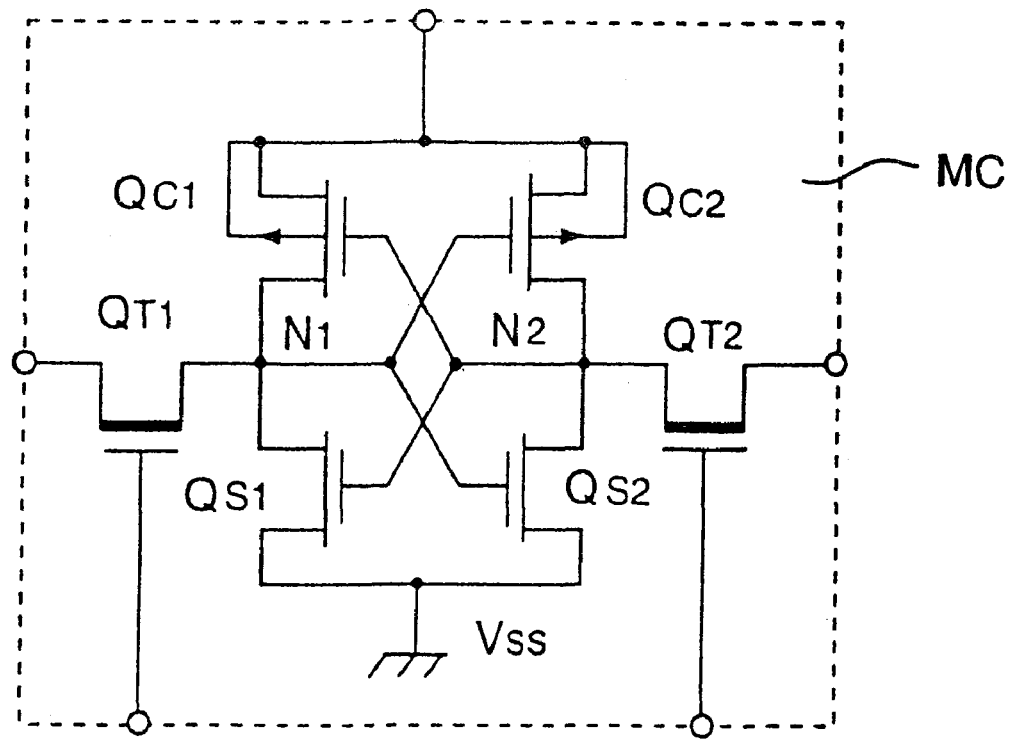
FIG. 22 shows an internal circuit of a memory cell of the embodiment of FIG. 21.

Now in the system based upon FIG. 9, the threshold voltage VT of the MOS transistors (QC1, QC2, QS1 and QS2) composing the data storage cells of the memory cell MC is set to 0.5 V, and the VT of the transfer MOS transistors (QT1 and QT2) is set to 0.2 V, as shown in FIG. 22. Specifically, the MOS transistors, as contained in the memory cell, are set to such a threshold voltage that the subthreshold current will not raise a problem in the entire SRAM, but the transfer MOS transistors are set to such a threshold voltage as requires attention. Moreover, the power source VCC to be supplied to that SRAM from the outside is set to 1 V; the boosted voltage level VCH, which is generated from the VCC by the voltage converter VC2, is set to 2 V (=2VCC); and the negative voltage of −VWB, which is generated from the same VCC by a voltage converter VC3, is set to 0.2 V.

In order to activate one sub-word line WL11, that is, to apply the cell enabling pulse, which will develop from the aforementioned negative voltage of −VWB (e.g., −0.2 V) to VCC (1 V), to WL11, for example, a global word line GL1 and a control line RX1 may be activated by the address signal. For activating this control signal RX1, there is utilized a memory array activate signal Φsr1 which is generated by the YDEC·DRV and a timing control circuit TC for activating the memory array MA1 substantially. Specifically, it is sufficient to apply the pulse, which develops from −VWB to the VCC by a level converter LCB receiving the signal Φsr1, to the RX1 and to apply the pulse, which develops from the VCC to the −VWB by another level converter LCB connected to the GL12, to the GL1.

The global word line GL1 is activated from the row address AX by the row address decoder/driver XDEC·DRV. At this time, the remaining GL lines (or global word lines) and the remaining RX lines are left at VCC and −VWB, respectively. In the switch MOS activate signal group (ΦP1, ΦP2, - - -), on the other hand, only the signal ΦP1 is activated by another level converter LCA into the pulse to develop from 0 V to VCH, whereas the remaining signals are left at 0 V. As a result, the switch MOS to be connected to the lines PL11, - - -, and PLn1 are turned off, but the corresponding switch MOS group of the inactivated memory array is left on. In order to develop the signal ΦP1 from 0 V to the VCH, there is utilized a memory array activate signal Φsp1 which is generated by the YDEC·DRV and the timing control circuit TC2 to activate the memory array MA1 substantially. Thus, the memory cell (MC) group on the WL1 is enabled to perform the aforementioned operations.

Figure 2:
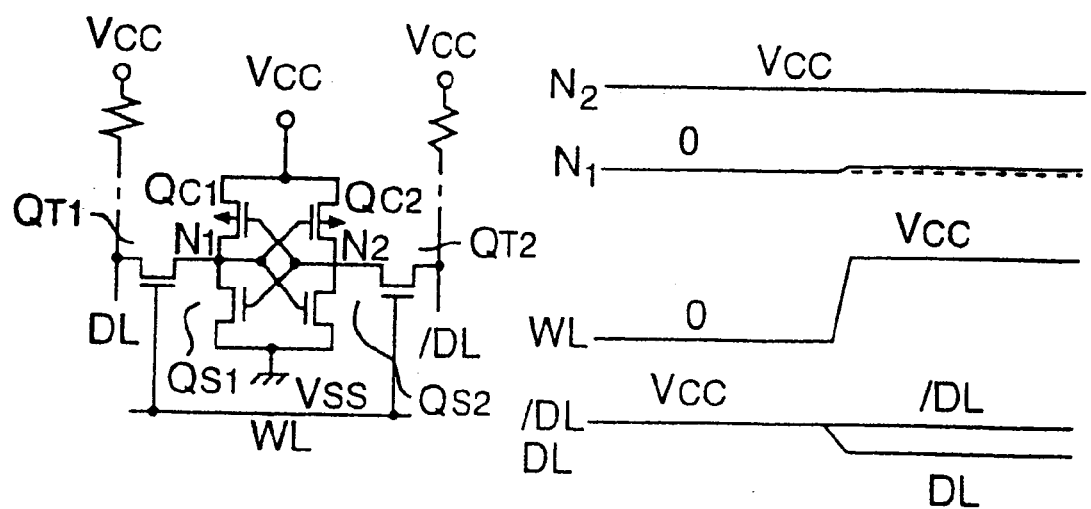
FIG. 2 illustrates problems of the conventional static memory cell.

Transistors Q'D1 and Q'D2 on each data line pair are acceleration transistors for precharging the voltage of the data line pair to VCC at high speed. Moreover, the circuit RWC is a read/write circuit to be activated by a column read activate signal (ΦRY1) similar to that of FIG. 2, and all of these circuits use a low VT. N-channel and P-channel MOS transistors are connected in parallel to be activated by the column write activate signals (ΦWY1 and /ΦWY1) for performing the writing operations from the I/O line to the data lines at a high speed.

By the multi-division/partial-drive of the word lines and the power supply lines thus far described, the load upon the packaged VCH or −VWB generator can be lightened to facilitate the single power source design better, because the power supplying lines and the word lines, as required for supplying electric power to the VCH and −VWB due to the voltage fluctuation according to the operations, are localized on the sub-power supply lines and the sub-word lines WL11.

This embodiment is advantageous in that the increase in the area accompanying the division is small because it is sufficient to add only one switch MOS to each power supplying line. Since the signal ΦP1 is a high voltage (VCH) pulse, however, the power for charging/discharging the gate capacitance of the numerous switch MOS transistors connected to that line is relatively increased.

Figure 23:
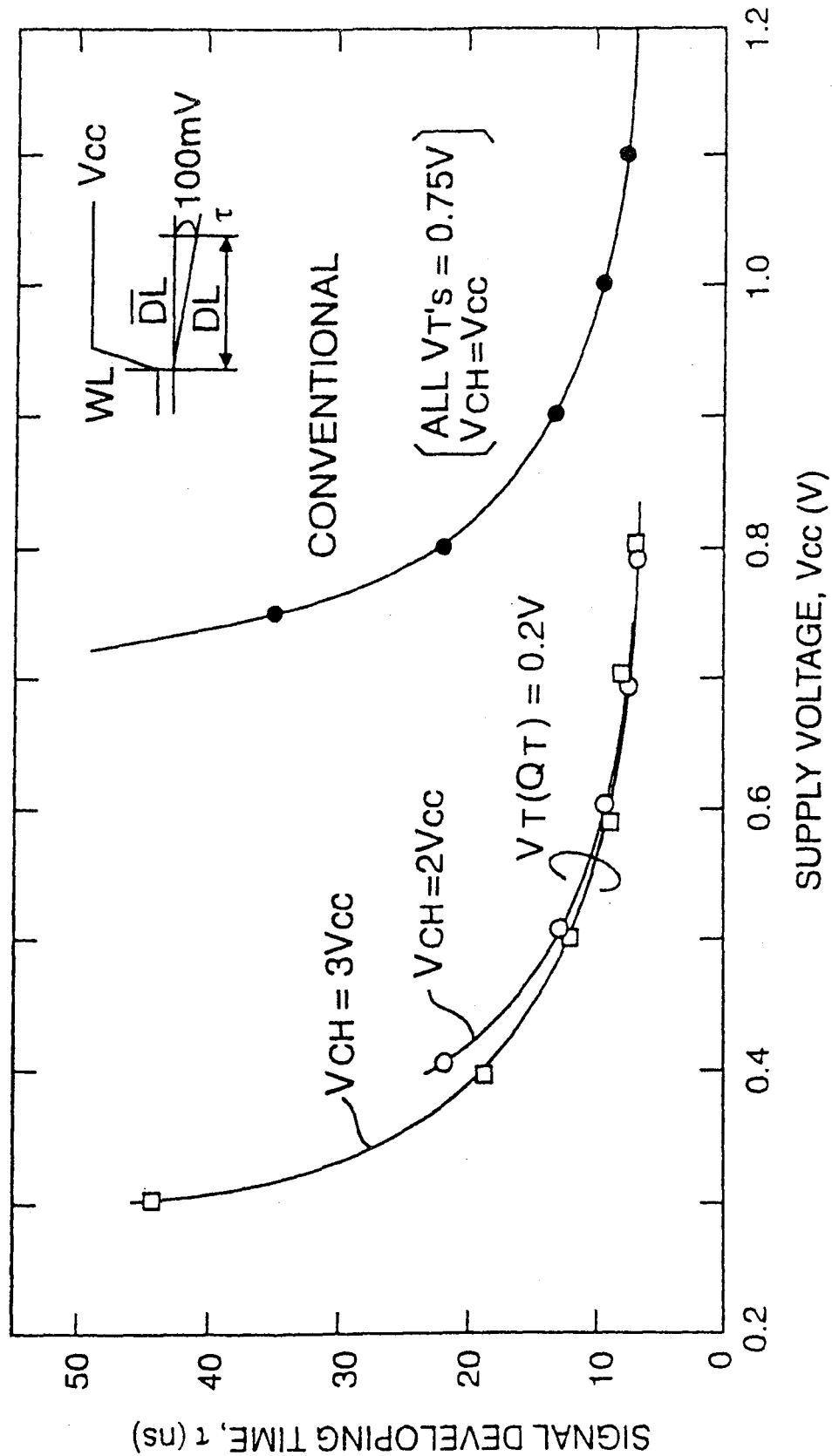
FIG. 23 is a characteristic diagram plotting signal developing time against supply voltage for the memory cell of FIG. 22.

FIG. 23 plots the operating voltage margin of the memory cell of FIG. 22. In FIG. 23, the abscissa indicates the supply voltage VCC supplied from the outside, and the ordinate indicates the signal developing time τ which is defined by the time period from the instant when the word line WL is activated (from 0 V to the VCC) to the instant when the potential difference between the data lines DL and /DL reaches 100 mV. The signal developing time τ is the better if it is the shorter.

The conventional curve (solid circles) plots the characteristics of the conventional memory cell in which it is assumed that all six MOS transistors in the memory cell of FIG. 22 have equal threshold voltages VT=0.75 V and in which the source side power supply nodes (i.e., the higher power supply nodes of the memory cell) of the QC1 and QC2 are connected directly to the supply voltage VCC. In this conventional construction, the MOS transistors have a high VT so that the subthreshold current raises no substantial problem. It is, however, found that the signal developing time τ abruptly increases for a supply voltage less than 0.8 V, so that the conventional construction cannot operate. In other words, when the supply voltage VCC becomes lower than the threshold voltage VT of the MOS transistors used, the memory cell fails to operate substantially by the increase in the developing time τ.

On the other hand, the use of the memory cell of the present invention, as shown in FIG. 22, allows the operations at a lower supply voltage. The curve, as indicated by open circles in FIG. 23, is calculated by setting the threshold voltage of the QC1, QC2, QS1, and QS2 that constitute the data storage cell in the memory cell of FIG. 22 to 0.75 V, and the threshold voltage of the transfer MOS transistors QT1 and QT2 to 0.2 V. Moreover, the boosted voltage VCH is calculated for the two cases of 2VCC and 3VCC, the calculated points of which are plotted by circles and squares, respectively. It is understood that this example operates for τ=10 ns even if the supply voltage becomes lower than the threshold voltage of the MOS transistors of the data storage cell up to about 0.5 V.

In other words, according to the present invention, there is provided a method of constructing an SRAM which can operate at a voltage lower than the threshold voltage of the MOS transistors of the data storage cell, even though the threshold voltage cannot be made lower than a predetermined value (e.g., 0.5 V) by the restriction of the subthreshold current. Since the threshold voltage of QT1 and QT2 is set in FIG. 22 to a value such as 0.2 V, which raises the problem of the subthreshold current, the lower signal level of the word lines is set to −VWB so that no subthreshold current may flow through the QT1 and QT2 when the memory cell is not activated. When MOS transistors having threshold voltages of 0.5 V are used so as not to raise the problem of the subthreshold current in the QT1 and QT2, the higher signal level of the word lines may be boosted sufficiently to enhance their driving abilities.

Moreover, a sufficient low-voltage operation can be achieved if the load MOS transistors on the data lines or the VT of the MOS transistors in the read/write circuit RWC, as shown in FIG. 21, is made sufficiently low (e.g., 0.2 V or less). The remaining peripheral drive/logic circuits are enabled to exhibit their effects at a sufficiently low VT, i.e., a sufficiently low VCC by using the subthreshold current which is described in the aforementioned entitled "VLSI Memory". As a result, the chip entirety can operate even at the VCC lower than the VT of the in-cell cross-coupled MOS transistors.

The present invention is advantageous especially in that it is operated by a low supply voltage, such as a battery. Specifically, the SRAM can be operated by a solar cell which has a supply voltage of about 0.5 V. Moreover, the effect of reducing the power consumption is prominent because the operating voltage can be lowered.

Figure 24:
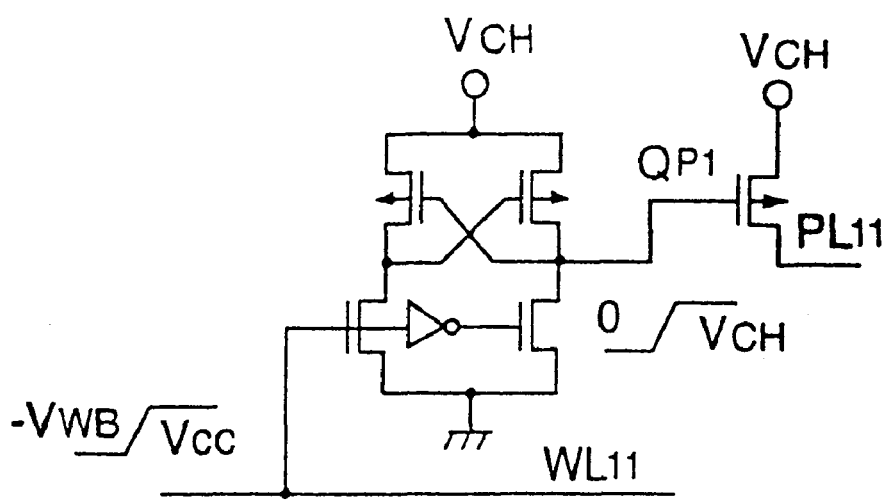
FIG. 24 illustrates an embodiment of a system for driving the divided power supply lines of FIG. 21.

FIG. 24 shows another embodiment for reducing the power consumption although its area is rather enlarged. For simplicity, there is shown only the WL11 and PLl1 of FIG. 21. Although the MOS transistors PL11 to PLn1 of FIG. 21 for switching the VCH are simultaneously controlled by the single signal ΦP1, the switch MOS and a level converter for controlling the gate of the former are added in FIG. 24 to each of the divided power supply lines. When the WL11 is activated so that an enable pulse is applied, for example, the gate of the QPL1 is switched from 0 to the VCH so that the QPL1 is turned off. As a result, only one gate capacitance is to be driven by the high voltage (VCH), so that the power consumption is reduced. At this time, the gates of the remaining switch MOS transistors are left at 0 V.

As is now apparent from the foregoing embodiments, the present invention can realize a semiconductor integrated circuit in which are incorporated fast static memory cells having a wide voltage margin without increasing current consumption even in a low-voltage operation.

Various modifications of the foregoing invention will become apparent to those of ordinary skill in the art. All such modifications that basically rely upon the teachings through which the present invention have advanced the state of the art are properly considered within the spirit and scope of the following claims.

We claim:

1. A semiconductor device comprising:
  a memory cell including a first inverter having an input coupled to a first storage node and an output coupled to a second storage node, a second inverter having an input coupled to the second storage node and an output coupled to the first storage node, a first transistor coupled to the first storage node and a second transistor coupled to the second storage node, the first and second inverters each receiving a power supply voltage and a reference voltage lower than the power supply voltage;
  a word line coupled to gates of the first and second transistors;
  a data line pair, one of which is coupled to the first transistor and the other of which is coupled to the second transistor;
  a power supply line coupled to the first and second inverters and providing the power supply voltage;
  a third transistor having a source-drain path between the power supply line and a first node to which a first potential is applied;
  a fourth transistor having a source-drain path between the power supply line and a second node to which a second potential lower than the first potential is applied,
  wherein signals are applied to gates of the third and fourth transistors to establish a first state that the third and fourth transistors are made conductive and non-conductive, respectively, and a second state that the third and fourth transistors are made non-conductive and conductive, respectively; and
  the semiconductor device further comprising a driver providing the word line with a voltage lower than the first potential to make the first and second transistors both conductive.

2. A semiconductor device according to claim 1, wherein the first and second transistors are n-type transistors and the third and fourth transistors are p-type transistors.

3. A semiconductor device comprising:
  a memory cell including a first inverter having an input coupled to a first storage node and an output coupled to a second storage node, a second inverter having an input coupled to the second storage node and an output coupled to the first storage node, a first transistor coupled to the first storage node and a second transistor coupled to the second storage node, the first and second inverters each receiving a power supply voltage and a reference voltage lower than the power supply voltage;
  a word line coupled to gates of the first and second transistors;
  a data line pair, one of which is coupled to the first transistor and the other of which is coupled to the second transistor;
  a power supply line coupled to the first and second inverters and providing the power supply voltage;
  a third transistor having a source-drain path between the power supply line and a first node to which a first potential is applied;
  a clamp circuit coupled between the power supply line and a second node to which a second potential lower than the first potential is applied,
  wherein a signal is applied to a gate of the third transistor to establish a first state that the third transistor is made conductive and a second state that the third transistor is made non-conductive; and
  the semiconductor device further comprising a driver providing the word line with a voltage lower than the first potential to make the first and second transistors both conductive.

4. A semiconductor device according to claim 3, wherein the first and second transistors are n-type transistors and the third transistor is a p-type transistor.

* * * * *